United States Patent [19]
Uchida

[11] Patent Number: 5,805,497
[45] Date of Patent: Sep. 8, 1998

[54] SEMICONDUCTOR STATIC RANDOM ACCESS MEMORY CELL WITH ADDITIONAL CAPACITOR COUPLED TO MEMORY NODES AND PROCESS OF FABRICATION THEREOF

[75] Inventor: Tetsuya Uchida, Tokyo, Japan

[73] Assignee: NEC Corporation, Tokyo, Japan

[21] Appl. No.: 827,367

[22] Filed: Mar. 27, 1997

[30] Foreign Application Priority Data

Mar. 29, 1996 [JP] Japan ........................................ 8-76098

[51] Int. Cl.$^6$ .................................................. H01L 29/76
[52] U.S. Cl. ............................. 365/156; 365/174; 365/180
[58] Field of Search ..................................... 365/156, 174, 365/180; 257/903, 904

[56] References Cited

U.S. PATENT DOCUMENTS 5,194,749  3/1993  Meguro et al. ........................... 365/156
5,594,270  1/1997  Hiramoto et al. ........................ 365/156

OTHER PUBLICATIONS

F. Assaderaghi et al., "A Dynamic Treshold Voltage MOSFET (DTMOS) for Ultra–Low Voltage Operation", *IEDM 94*, 1994, pp. 809–812.

G. Shahidi et al., "SOI For A *1–Volt* CMOS Technology and Application to a 512Kb SRAM with 3.5 ns Access Time", *IEDM 93*, 1993, pp. 813–816.

*Primary Examiner*—Vu A. Le
*Attorney, Agent, or Firm*—Sughrue, Mion, Zinn, Macpeak & Seas, PLLC

[57] ABSTRACT

A semiconductor static random access memory cell is implemented by four field effect transistors formed on a silicon layer over a buried silicon oxide layer and two resistors formed in an inter-level insulating structure; additional capacitors are formed under the buried silicon oxide layer, and are respectively connected to the gate electrodes of the field effect transistors serving as driving transistors of the memory cell so as to enhance the stability of the memory cell without increase the transistor size.

7 Claims, 24 Drawing Sheets ers are hatched in FIGS. 2A, 3A and 4A
SEMICONDUCTOR STATIC RANDOM ACCESS MEMORY CELL WITH ADDITIONAL CAPACITOR COUPLED TO MEMORY NODES AND PROCESS OF FABRICATION THEREOF

FIELD OF THE INVENTION

This invention relates to a semiconductor static random access memory cell and, more particularly, to a structure of a semiconductor static random access memory cell fabricated on a semiconductor substrate with a buried insulating layer and having additional capacitor coupled to memory nodes and a process of fabrication thereof.

DESCRIPTION OF THE RELATED ART

Two kinds of field effect transistor are used for a semiconductor integrated circuit device. One of the two kinds of field effect transistor is called as "p-channel type field effect transistor", and is fabricated on an n-type semiconductor substrate. The p-channel type field effect transistor has a p-type source region and a p-type drain region spaced from each other by a channel region, and the channel region is covered with a thin gate oxide layer which in turn is overlain by a gate electrode. The other kind of the field effect transistor is called as "n-channel type field effect transistor", and is fabricated on a p-type semiconductor substrate. The n-channel type field effect transistor has an n-type source region and an n-type drain region spaced from each other by a channel region, and the channel region is also covered with a thin gate oxide layer which in turn is overlain by a gate electrode.

Growing research and development efforts are being made for faster semiconductor integrated circuit device, and a load capacitance coupled to the source/drain region deeply concerns the signal propagation speed and, accordingly, the operation speed of the semiconductor integrated circuit device. As described hereinbefore, the source/drain region is opposite in conductivity type to the semiconductor substrate, and the p-n junction forms a parasitic capacitor coupled to the source/drain region. The parasitic capacitor serves as a capacitive load, and a signal source is required to firstly accumulate the capacitive load. For this reason, the parasitic capacitor in the signal propagation path decelerates the electric signal.

One of the solution is proposed by G. G. Shahidi et. al. in "SOI For a 1-Volt CMOS Technology and Application to a 512 Kb SRAM With 3.5 ns Access Time", IEDM 93, pages 813 to 816. The paper proposes to use an SOI (Silicon-On-Insulator) substrate, which give low junction capacitance to a source/drain region. The SOI substrate has a buried insulating layer overlain by a silicon layer, and the upper surface of the buried insulating layer is as deep as the bottom of the source/drain region formed in the silicon layer. Although the source/drain region forms a p-n junction with the silicon layer, the p-n junction is terminated at the upper surface of the buried insulating layer, and the junction capacitance is drastically decreased. This results in a speed-up of the signal propagation.

The field effect transistors forms various kinds of electric circuits, and a static random access memory cell is one of the electric circuits strongly requested to be speeded up. FIG. 1 illustrates a typical circuit configuration of the static random access memory cell. Two highly resistive load elements R1/R2 and four n-channel enhancement type field effect transistors T1/T2/T3/T4 form in combination the static random access memory cell.

The highly resistive load elements R1/R2 are respectively connected in series to the n-channel enhancement type field effect transistors T1/T2, and the two series combinations are connected in parallel between a positive power supply line Vcc and a ground voltage line Vss. The drain nodes of the n-channel enhancement type field effect transistors T1/T2 serve as memory nodes N1/N2, and a data bit is stored in the form of potential difference between the memory nodes N1 and N2.

The other n-channel enhancement type field effect transistors T3/T4 are connected between digit lines D1/D2 and the memory nodes N1/N2, and the n-channel enhancement type field effect transistors T3/T4 are concurrently gated by a pair of word lines W1/W2.

The n-channel enhancement type field effect transistors T1/T2/T3/T4 are fabricated on a semiconductor substrate. If the semiconductor substrate has the SOI structure, the buried insulating layer decreases the junction capacitance coupled to each of the source/drain regions, and, accordingly, improves the data transfer speed.

FIGS. 2A, 2B, 3A, 3B, 4A and 4B illustrate the layout and the structure of the static random access memory cell fabricated on the SOI substrate. The static random access memory cell is enclosed with dots-and-dash line DDL1 in FIGS. 2A, 3A and 4A. The pattern enclosed with the dots-and-dash line DDL1 is repeated in the direction of lines A—A, B—B and C—C, and repeated as an mirror image in the direction perpendicular to lines A—A, B—B and C—C.

Referring first to FIGS. 2A and 2B, the prior art static random access memory cell is fabricated on an SOI substrate 1. A buried oxide layer 1b is formed on a p-type silicon substrate 1a, and is overlain by a p-type silicon layer 1c. The p-type silicon substrate 1a, the buried oxide layer 1b and the p-type silicon layer 1c form in combination the SOI substrate 1.

A thick field oxide 2a is selectively grown on the p-type silicon layer 1c, and defines active areas. The outer peripheries of the active areas are hatched in FIGS. 2A, 3A and 4A so as to be clearly discriminated from other layers. Predetermined sub-areas in the active areas are respectively covered with thin gate oxide layers 3a, and n-type source/drain regions 3b are formed on both sides of each predetermined sub-area for the n-channel enhancement type field effect transistors T1/T2/T3/T4. The word lines W1/W2 extend over the thin gate oxide layers 3a of the n-channel enhancement type field effect transistors T3/T4, respectively, and parts of the word lines W1/W2 on the thin gate oxide layers 3a serve as gate electrodes 3c of the n-channel enhancement type field effect transistors T3/T4.

Conductive strips ST1/ST2 extend over the thin gate oxide layers 3a and the thick field oxide layer 2a, and are respectively held in contact with the n-type drain regions 3b of the n-channel enhancement type field effect transistors T1/T2. The n-type drain regions 3b of the n-channel enhancement type field effect transistors T1/T2 serve as the memory nodes N1/N2, respectively, and parts of the conductive strips ST1/ST2 on the thin gate oxide layers 3a serve as gate electrodes 3d of the n-channel enhancement type field effect transistors T1/T2, respectively. Thus, the n-channel enhancement type field effect transistors T1/T2/T3/T4 are fabricated on the SOI substrate 1.

Turning to FIGS. 3A and 3B of the drawings, the n-channel enhancement type field effect transistors T1/T2/T3/T4 are covered with a first inter-level insulating layer 2b, and contact holes 4a/4b are formed in the first inter-level insulating layer 2b over the n-type source regions 3b of the n-channel enhancement type field effect transistors T1/T2. The contact holes 4a/4b are marked with "x" in FIG. 3A. A conductive strip 5a is formed on the first inter-level insulating layer 2b, and is held in contact with the n-type source regions 3b of the n-channel enhancement type field effect transistors T1/T2 through the contact holes 4a/4b. The conductive strip 5a serves as the ground voltage line Vss.

Turning to FIGS. 4A and 4B of the drawings, the conductive strip 5a is covered with a second inter-level insulating layer 2c, and contact holes 4c/4d are formed in the first and second inter-level insulating layers 2b/2c. The contact holes 4c/4d are also marked with "x" in FIG. 4A. The contact holes 4c/4d reach the n-type drain regions 3b serving as the memory nodes N1/N2, and thin resistive strips 5b/5c are held in contact with the memory nodes N1/N2 through the contact holes 4c/4d, respectively. The highly resistive load elements R1/R2 are implemented by the thin resistive strips 5b/5c, respectively.

The thin resistive strips 5b/5c are covered with a third inter-level insulating layer 2d, and contact holes 4e/4f are formed in the first, second and third inter-level insulating layers 2b/2c/2d. The contact holes 4e/4f are also marked with "x". Conductive strips 5d/5e extend in parallel over the third inter-level insulating layer 2d, and are held in contact with the n-type source/drain regions 3b through the contact holes 4e/4f, respectively. The conductive strips 5d/5e serve as the digit lines D1/D2. In order to simplify the layout, the conductive strips 5d/5e or the digit lines D1/D2 are not drawn on the third inter-level insulating layer 2d in FIG. 4A. However, the locations of the digit lines D1/D2 are indicated by cross sections on both sides thereof.

All of the n-type source/drain regions 3b of the n-channel enhancement type field effect transistors T1/T2/T3/T4 are held in contact with the buried oxide layer 1b, and form the p-n junction with the p-type silicon layer 1c along the side surfaces thereof. For this reason, only small amount of parasitic capacitance is coupled to each of the n-type source/drain regions 3b, and is rapidly charged in the operation. However, a problem is encountered in the prior art semiconductor static random access memory cell in the stability. This is because of the fact that the memory nodes N1/N2 merely accumulate a small amount of electric charge. When the n-channel enhancement type field effect transistors T3/T4 turn on so as to access the data bit stored therein, the potential level in the memory node N1/N2 is widely changed from the initial potential level. Thus, the semiconductor static random access memory cell is unstable.

The small capacitance of the memory node N1/N2 prolongs the access time, because only a small potential difference takes place between the digit lines D1/D2.

The small capacitance of the memory node N1/N2 further makes the process margin of the prior art semiconductor static random access memory cell small, and the prior art semiconductor static random access memory cell suffers from a production yield.

If the cell ratio, i.e., the ratio of the current driving capability of the n-channel enhancement type field effect transistors T1/T2 to the current driving capability of the n-channel enhancement type field effect transistors T3/T4 is enlarged, the stability is enhanced, and the margin is increased. The cell ratio is usually enlarged by increasing the channel width of the n-channel enhancement type field effect transistors T1/T2. However, the wide channel width results in increase of the area occupied by the prior art semiconductor static random access memory cell, and decreases the integration density of the prior art static random access memory cells on a single semiconductor chip.

SUMMARY OF THE INVENTION

It is therefore an important object of the present invention to provide a semiconductor static random access memory cell which is improved in stability without sacrifice of the integration density.

It is also an important object of the present invention to provide a process of fabricating the semiconductor static random memory cell which is improved in production yield.

To accomplish the object, the present invention proposes to form additional capacitor coupled to gate electrodes of driving transistors under a buried insulating layer.

In accordance with one aspect of the present invention, there is provided a semiconductor static random access memory cell fabricated on a substrate having a first semiconductor layer of a first conductivity type, a first insulating layer formed on the first semiconductor layer and a second semiconductor layer of the first conductivity type formed on the first insulating layer, comprising: first and second impurity regions formed in the first semiconductor layer, and having a second conductivity type opposite to the first conductivity type so as to form first and second additional capacitors; a first isolating layer formed in a surface portion of the first semiconductor layer between the first and second impurity regions; a second isolating layer formed in the second semiconductor layer in such a manner as to be held in contact with the first insulating layer so as to divide the second semiconductor layer into a first semiconductor sub-layer and a second semiconductor sub-layer; a first driving transistor including first source and drain regions of the second conductivity type formed in a first portion of the first semiconductor sub-layer, a first gate insulating layer formed on a first channel region between the first source and drain regions and a first gate electrode formed on the first gate insulating layer and held in contact with the first impurity region through a first contact hole formed in the second isolating layer and the first insulating layer; a first transfer transistor including second source and drain regions formed in a second portion of the first semiconductor sub-layer, a second gate insulating layer formed on a second channel region between the second source and drain regions and a second gate electrode formed on the second gate insulating layer, one of the second source and drain regions being connected to one of the first source and drain regions; a second driving transistor including third source and drain regions of the second conductivity type formed in a first portion of the second semiconductor sub-layer, a third gate insulating layer formed on a third channel region between the third source and drain regions and a third gate electrode formed on the third gate insulating layer and held in contact with the second impurity region through a second contact hole formed in the second isolating layer and the first insulating layer; a second transfer transistor including fourth source and drain regions formed in a second portion of the second semiconductor sub-layer, a fourth gate insulating layer formed on a fourth channel region between the fourth source and drain regions and a fourth gate electrode formed on the fourth gate insulating layer, one of the fourth source and drain regions being connected to one of the third source and drain regions; a first conductive member connecting the one of the first source and drain regions to the third gate electrode; a second conductive member connecting the one of the third source and drain regions to the first gate electrode; an inter-level insulating structure covering the first driving transistor, the first transfer transistor, the second driving transistor and the second transfer transistor; a first power supply line formed in the inter-level insulating structure, and connected through resistive elements to one of the first source and drain regions and one of the third source and drain regions; a second power supply line different in potential level from the first power supply line, formed in the inter-level insulating structure, and connected to the other of the first source and drain regions and the other of the third source and drain regions; and first and second signal lines formed in the inter-level insulating structure, and connected to the other of the second source and drain regions and the other of the fourth source and drain regions.

In accordance with another aspect of the present invention, there is provided a process of fabricating a semiconductor static random access memory cell, comprising the steps of: a) preparing a substrate having a first semiconductor layer of a first conductivity type, a first insulating layer formed on the first semiconductor layer and a second semiconductor layer of the first conductivity type formed on the first insulating layer; b) forming a first isolating layer and a second isolating layer in the first semiconductor layer and the second semiconductor layer, respectively, so as to define a plurality of first active areas and a plurality of second active areas in the first semiconductor layer and the second semiconductor layer, respectively, the second isolating layer having bottom surface held in contact with the first insulating layer; c) forming first and second impurity regions of a second conductivity type opposite to the first conductivity type in the plurality of first active areas, respectively, for producing additional capacitors; d) forming a gate insulating layer covering at least first, second, third and fourth channel regions formed in the plurality of second active areas; e) forming first, second, third and fourth gate electrodes on the gate insulating layer over the at least first, second, third and fourth channel regions, respectively, the first and third gate electrodes being held in contact with the first and second impurity regions through contact holes formed in the second isolating layer and the first insulating layer; f) forming first source and drain regions, second source and drain regions, third source and drain regions and fourth source and drain regions in the plurality of second active areas on both sides of the first channel region, both sides of the second channel region, both sides of the third channel region and both sides of the fourth channel region, respectively, so that a first combination of the first channel region, the gate insulating layer, the first gate electrode and the first source and drain regions, a second combination of the second channel region, the gate insulating layer, the second gate electrode and the second source and drain regions, a third combination of the third channel region, the gate insulating layer, the third gate electrode and the third source and drain regions and a fourth combination of the fourth channel region, the gate insulating layer, the fourth gate electrode and the fourth source and drain regions respectively constitute a first driving transistor, a first transfer transistor connected to the first driving transistor, a second driving transistor isolated from the first driving transistor and the first transfer transistor and a second transfer transistor connected to the second driving transistor, respectively; and g) forming a first power voltage line connected to one of the first source and drain regions and one of the third source and drain regions, first and second resistors connected between a second power voltage line and the others of the first and third source and drain regions, a first signal line connected to one of the second source and drain regions and a second signal line connected to one of the fourth source and drain regions in a multi-layer inter-level insulating structure.

BRIEF DESCRIPTION OF THE DRAWINGS

The features and advantages of the semiconductor static random access memory cell and the process according to the present invention will be more clearly understood from the following description taken in conjunction with the accompanying drawings in which.

DESCRIPTION OF THE PREFERRED EMBODIMENTS

First Embodiment

Figure 1:
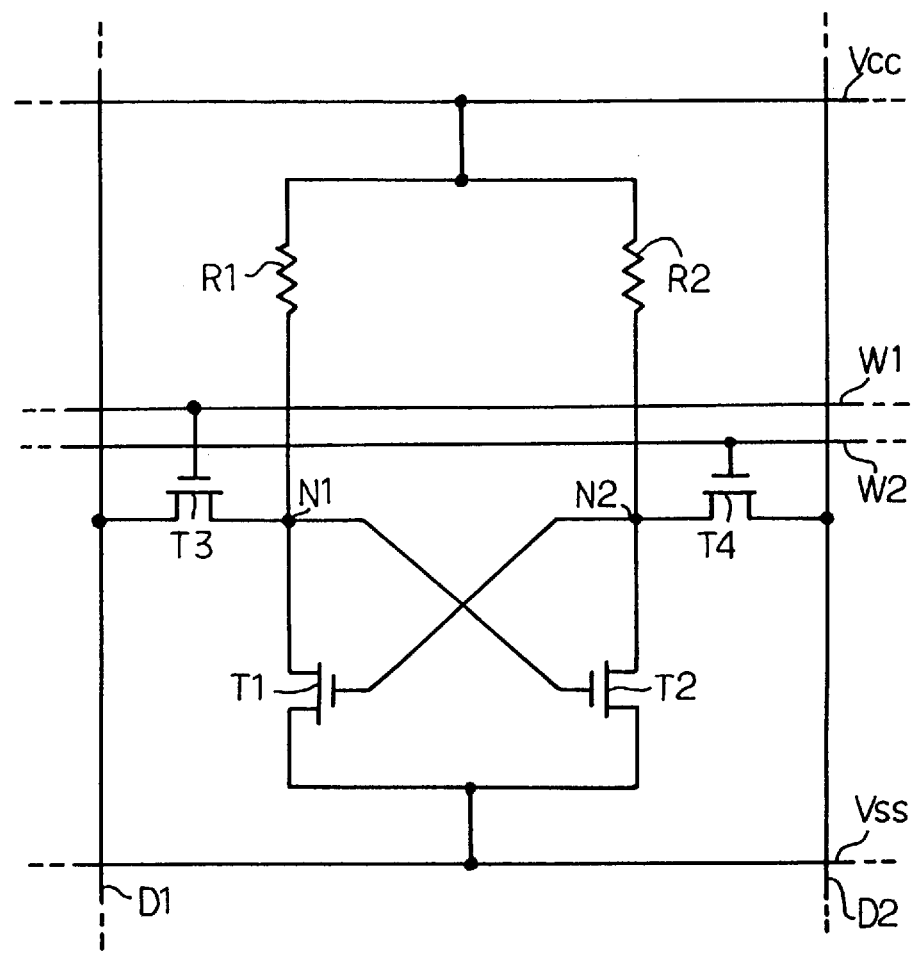
FIG. 1 is a circuit diagram showing the circuit configuration of the prior art static random access memory cell.
Figure 2A:
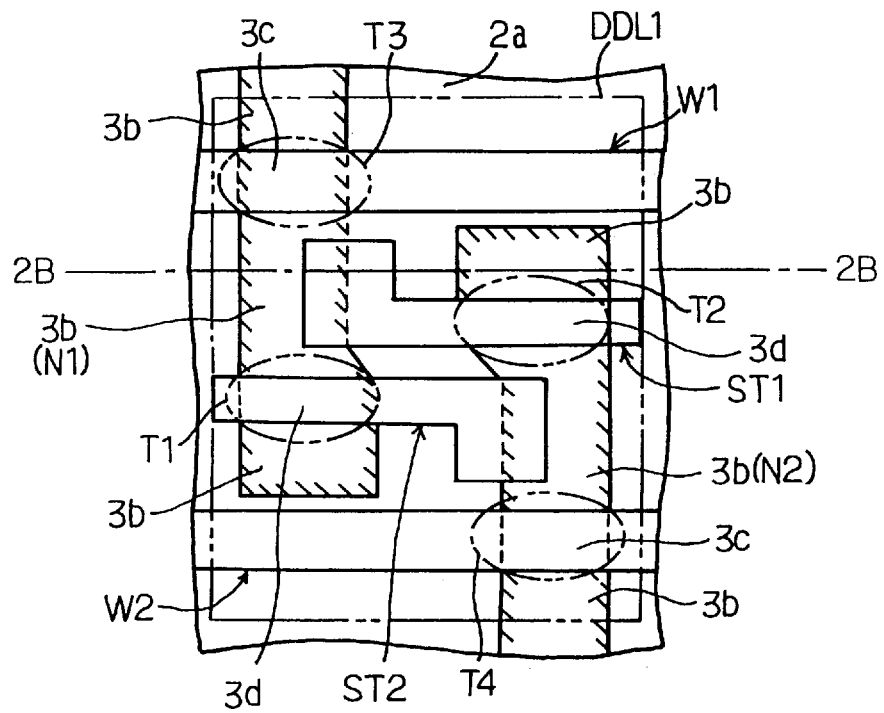
FIG. 2A is a plan view showing the layout of the field effect transistors of the prior art static random access memory cell.
Figure 2B:
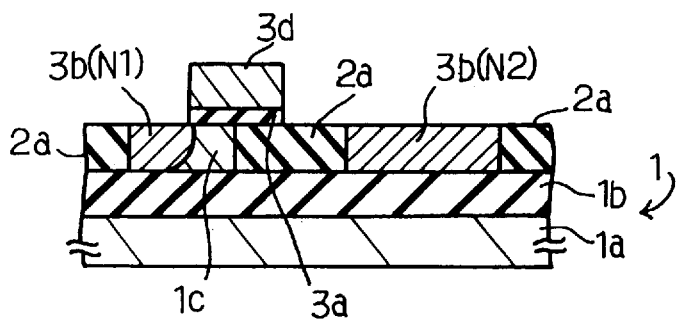
FIG. 2B is a cross sectional view taken along line A—A of FIG. 2A and showing the structure of the field effect transistors.
Figure 3A:
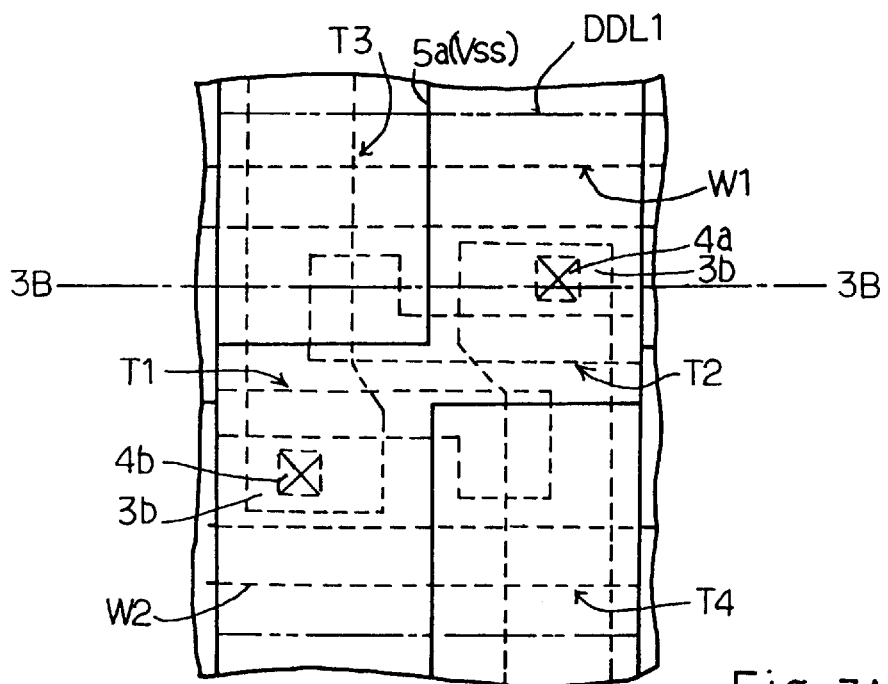
FIG. 3A is a plan view showing the layout of the contact holes formed in the inter-level insulating layer over the field effect transistors.
Figure 3B:
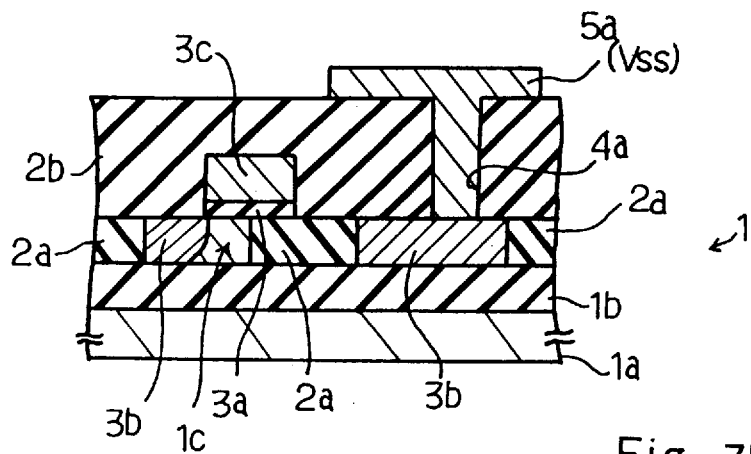
FIG. 3B is a cross sectional view taken along line B—B of FIG. 3A and showing the structure of the inter-level insulating layer.
Figure 4A:
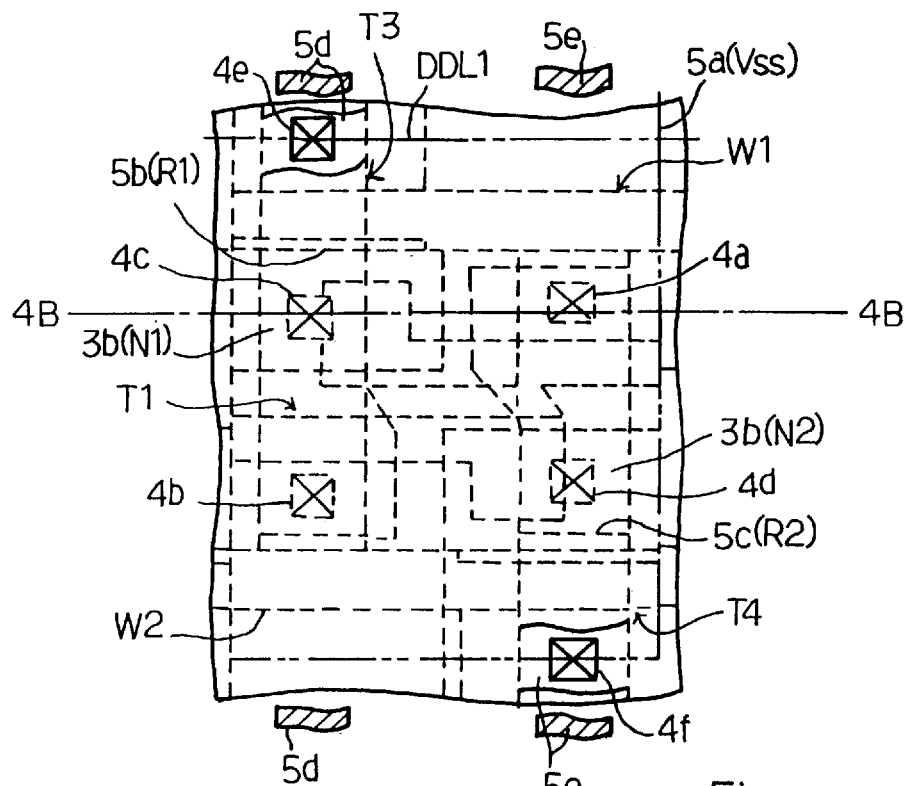
FIG. 4A is a plan view showing the layout of the multi-layer wiring structure of the prior art static random access memory cell.
Figure 4B:
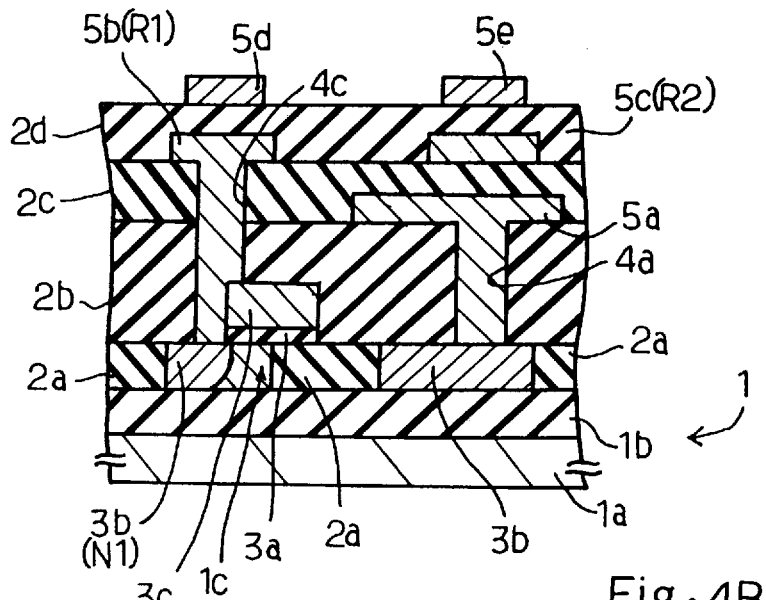
FIG. 4B is a cross sectional view taken along line C—C of FIG. 4A and showing the structure of the multi-layer wiring structure.

Description is hereinbelow made on a process of fabricating a semiconductor static random access memory cell embodying the present invention. The semiconductor static random access memory cell implementing the first embodiment is similar in circuit configuration to the prior art semiconductor static random access memory cell shown in FIG. 1, and comprises highly resistive load elements R11/R12 corresponding to the highly resistive load elements R1/R2, a pair of n-channel enhancement type driving transistors T11/T12 corresponding to the n-channel enhancement type field effect transistors T1/T2 and a pair of n-channel enhancement type transfer transistors T13/T14 corresponding to the n-channel enhancement type field effect transistors T3/T4. A data bit is stored in the form of potential difference between memory nodes N11/N12 as similar to the data bit stored in the prior art semiconductor static random access memory cell. The data bit is transferred to and from the semiconductor static random access memory cell through digit lines D11/D12, and the semiconductor static random access memory cell is electrically connected to the digit lines D11/D12 through the n-channel enhancement type transfer transistors T13/T14 gated by word lines W11/W12. These circuit components R11/R12, T11/T12, T13/T14, the digit lines D11/D12 and the word lines W11/W12 are hereinbelow described in detail with reference to FIGS. 5A/5B to 10A/10B/10C. An area assigned to the semiconductor static random access memory cell is indicated by dots-and-dash line DDL2 in FIGS. 6A, 7A, 8A, 9A and 10A.

Figure 5A:
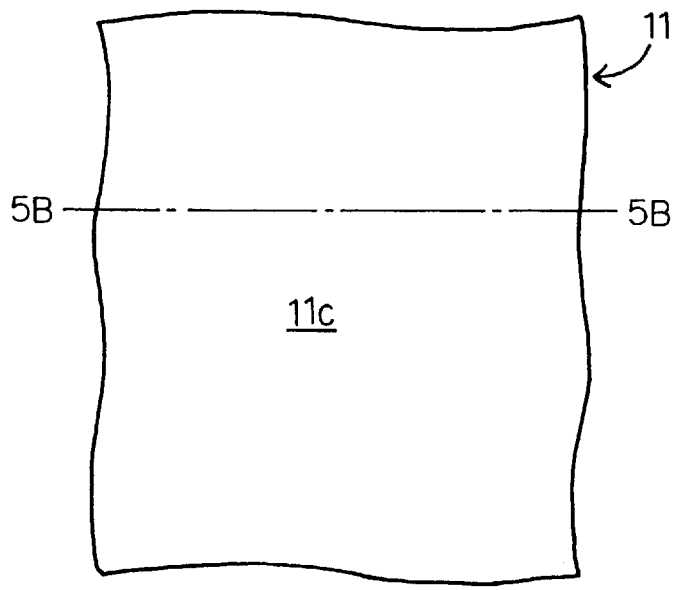
FIG. 5A is a plan view showing the major surface of a SOI substrate used for a semiconductor static random access memory cell according-to the present invention.
Figure 5B:
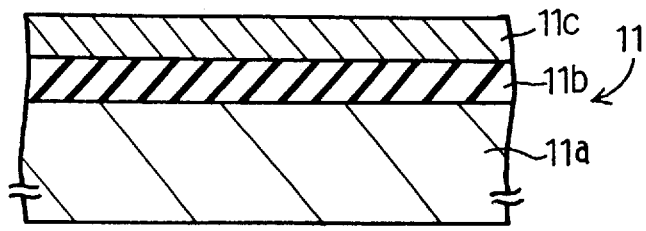
FIG. 5B is a cross sectional view taken along line D—D of FIG. 5A and showing the structure of the SOI substrate.

FIGS. 5A to 5C illustrate an SOI substrate 11 used for the semiconductor static random access memory cell. A p-type silicon substrate 11a is firstly prepared, and the dopant concentration is of the order of $1\times10^{17}$ cm$^{-3}$, and silicon oxide is grown to 150 nanometers thick on the p-type silicon substrate 11a by using a SIMOX technique. Then, the p-type silicon substrate 11a is overlain by a buried silicon oxide layer 11b. P-type silicon is grown to 110 nanometers thick on the buried silicon oxide layer 11b, and the buried silicon oxide layer 11b is overlain by a p-type silicon layer 11c.

Figure 6A:
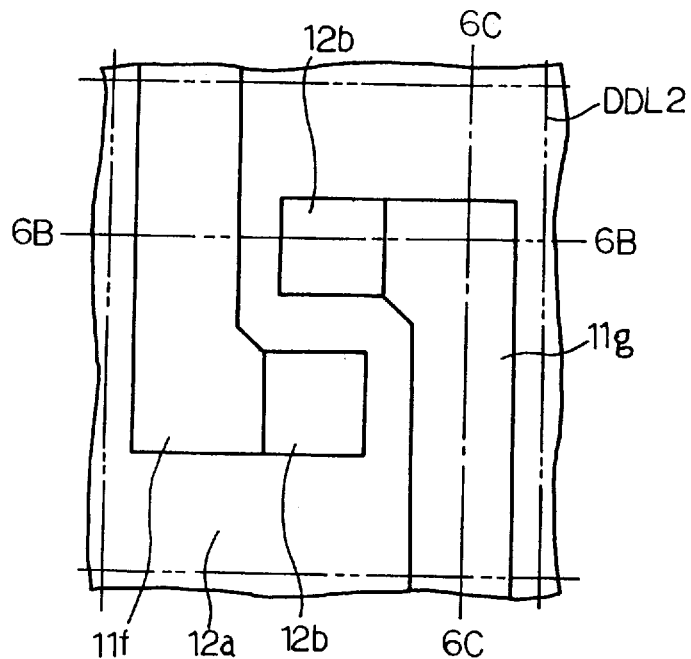
FIG. 6A is a plan view showing the layout of a resultant semiconductor structure in a first essential step.
Figure 6B:
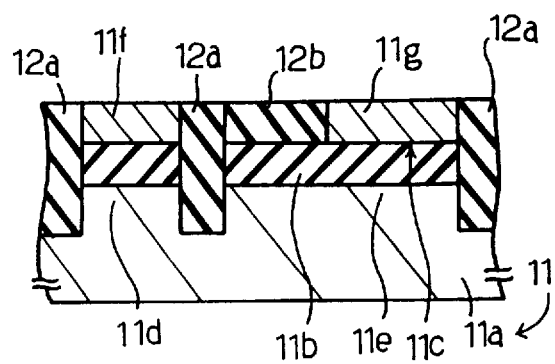
FIG. 6B is a cross sectional view taken along line E1—E1 of FIG. 6A and showing the structure of the resultant semiconductor structure.
Figure 6C:
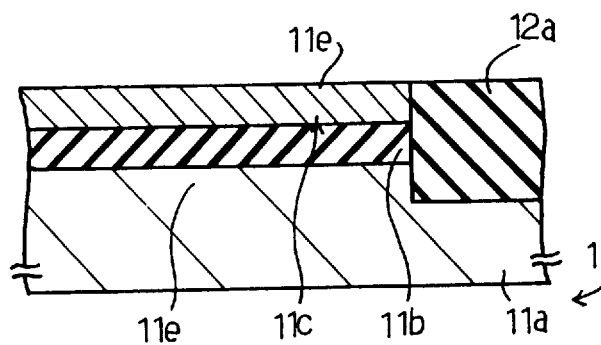
FIG. 6C is a cross sectional view taken along line E2—E2 of FIG. 6A and showing the structure of the resultant semiconductor structure from a different angle.

Subsequently, field oxide layers 12a and 12b are selectively grown on the SOI substrate 11 as shown in FIGS. 6A, 6B and 6C. The field oxide layer 12a penetrates through the p-type silicon layer 11c and the buried silicon oxide layer 11b into the p-type silicon substrate 11a, and defines active areas 11d and 11e in the p-type silicon substrate 11a. On the other hand, the field oxide layer 12b reach the buried silicon oxide layer 11b, and the field oxide layers 12a/12b define active areas 11f and 11g in the p-type silicon layer 11c.

Figure 7A:
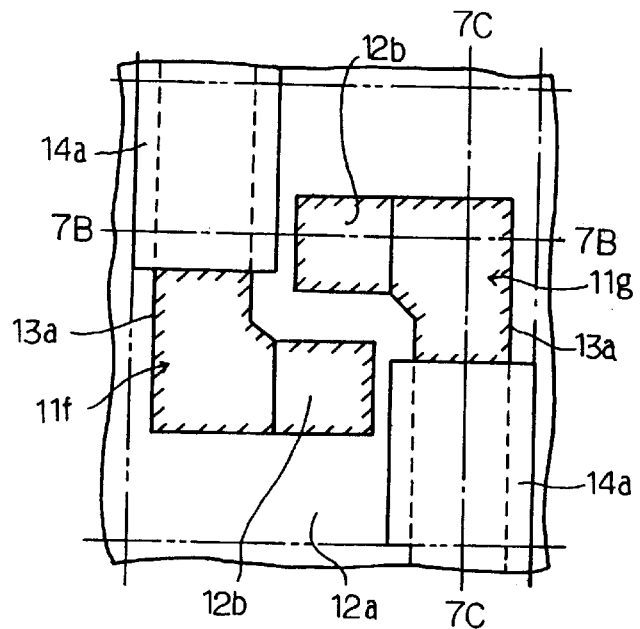
FIG. 7A is a plan view showing the layout of a resultant semiconductor structure in a second essential step.
Figure 7B:
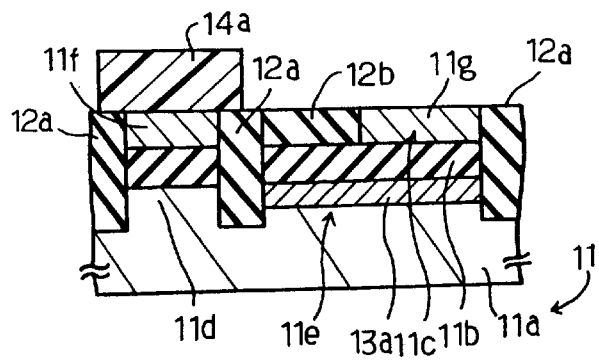
FIG. 7B is a cross sectional view taken along line F1—F1 of FIG. 7A and showing the structure of the resultant semiconductor structure.
Figure 7C:
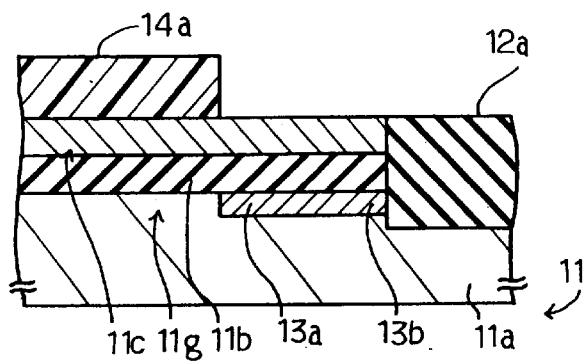
FIG. 7C is a cross sectional view taken along line F2—F2 of FIG. 7A and showing the structure of the resultant semiconductor structure from a different angle.

Subsequently, n-type impurity regions 13a are formed in the active areas 11d/11e for additional capacitors as shown in FIGS. 7A, 7B and 7C. Photo-resist solution is spread over the entire surface of the resultant semiconductor structure shown in FIGS. 6A to 6C, and is baked so as to form a photo-resist layer. A pattern image is transferred from a photo-mask (not shown) to the photo-resist layer, and a latent image is formed in the photo-resist layer for the pattern. The latent image is developed, and a photo-resist ion-implantation mask 14a is provided on the resultant semiconductor structure.

Phosphorous is ion implanted into the p-type silicon substrate 11a at dose of $1\times10^{14}$ cm$^{-2}$ under accelerating energy of 250 KeV. The phosphorous penetrates through the p-type silicon layer 11c/the field oxide layer 12b and the buried silicon oxide layer 11b, and forms the n-type impurity regions 13a in the p-type silicon substrate 11a. The outer periphery of the ion-implanted areas or the n-type impurity regions 13a are indicated by hatching lines in FIG. 7A.

Figure 8A:
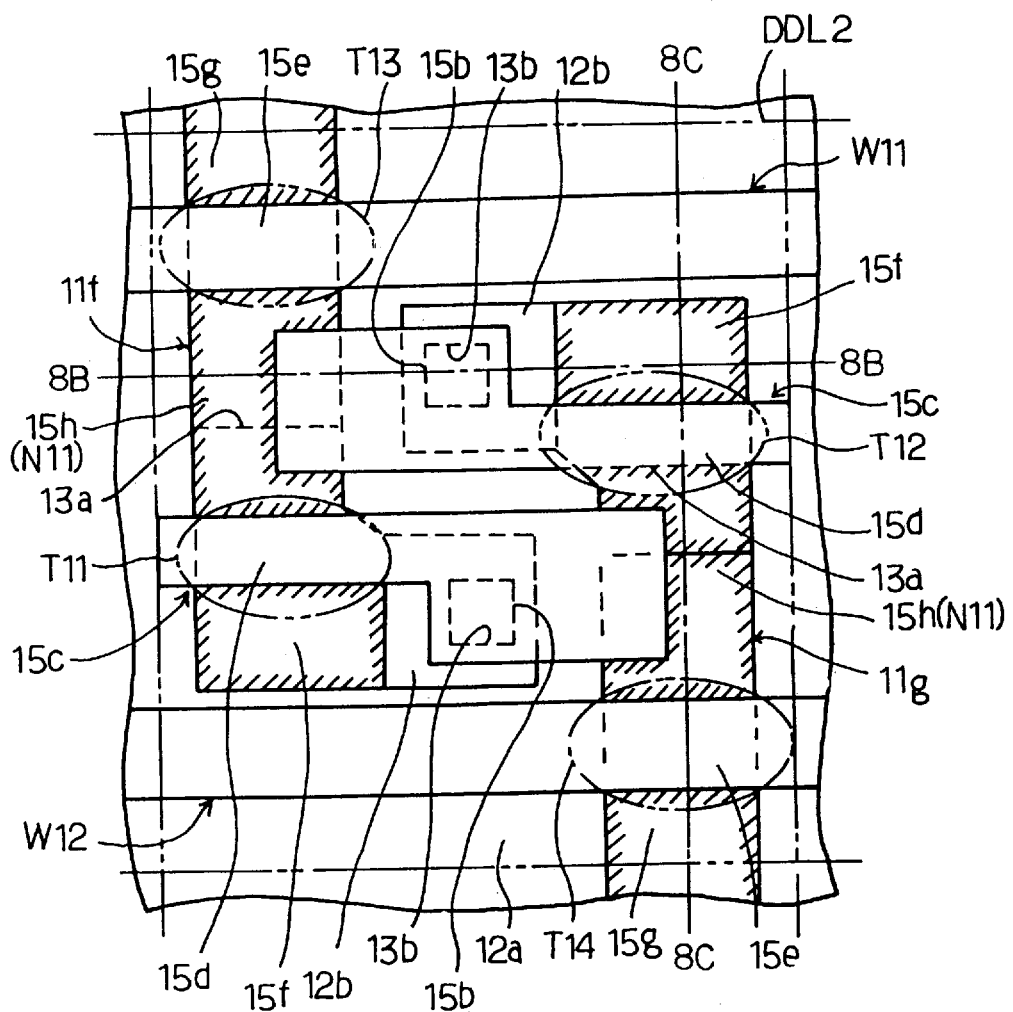
FIG. 8A is a plan view showing the layout of a resultant semiconductor structure in a third essential step.
Figure 8B:
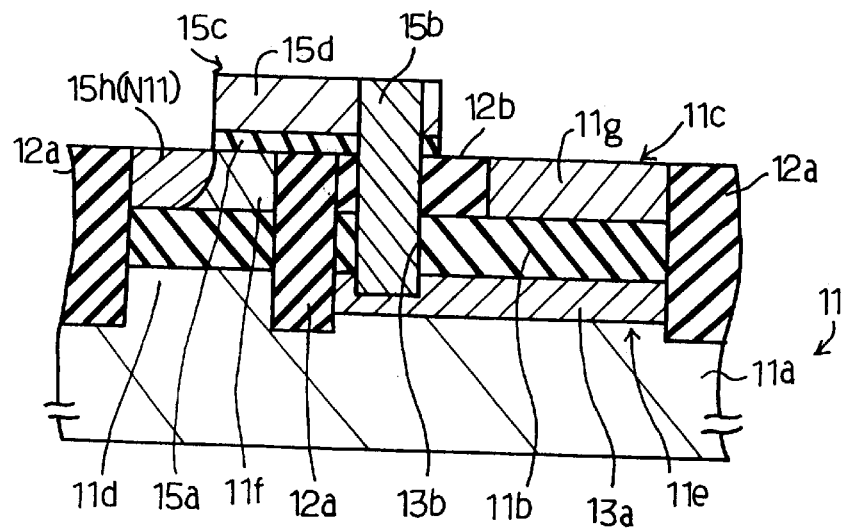
FIG. 8B is a cross sectional view taken along line G1—G1 of FIG. 8A and showing the structure of the resultant semiconductor structure.
Figure 8C:
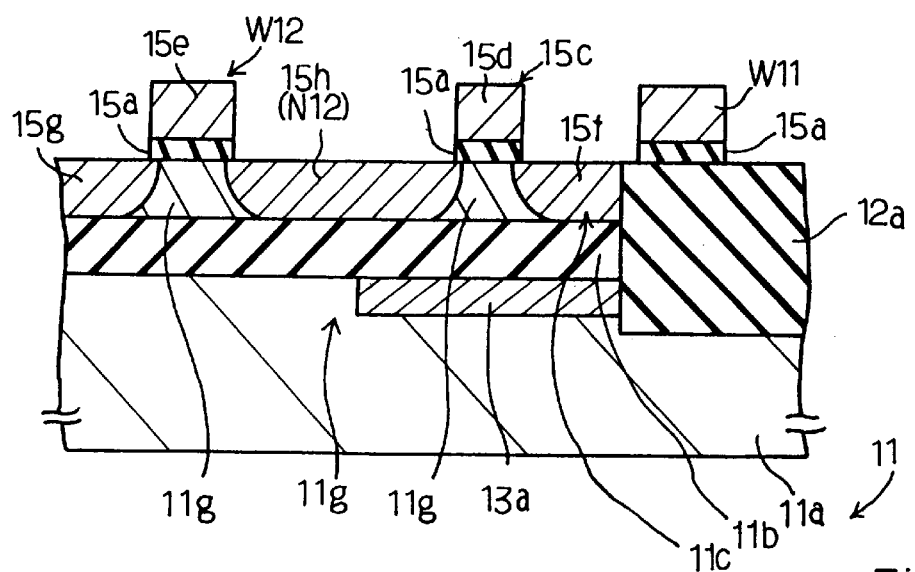
FIG. 8C is a cross sectional view taken along line G2—G2 of FIG. 8A and showing the structure of the resultant semiconductor structure from a different angle.

Subsequently, gate structures are formed for the n-channel enhancement type driving transistors T11/T12 and the n-channel enhancement type transfer transistors T13/T14 as shown in FIGS. 8A, 8B and 8C. Two process sequences are described hereinbelow for the gate structures.

The first process sequence starts with deposition of silicon oxide over the entire surface of the resultant semiconductor structure. The silicon oxide is of the order of 15 nanometers thick, and serves as gate oxide layers 15a. Polysilicon is deposited over the entire surface of the resultant semiconductor structure, and a polysilicon layer extends over the filed oxide layers 12a/12b and the silicon oxide layer. The polysilicon layer lightly oxidized, and is covered with a thin silicon oxide layer. A photo-resist etching mask (not shown) is provided over the thin silicon oxide layer by using the lithographic techniques, and has openings over the field oxide layers 12b. Using the photo-resist etching mask, the thin silicon oxide layer, the polysilicon layer, silicon oxide layer, the field oxide layers 12b and the buried silicon oxide layer 11b beneath the openings are etched away, and contact holes 13b reach the n-type impurity regions 13a. Tungsten is deposited over the entire surface of the resultant semiconductor structure. The tungsten fills the contact holes 13b, and swells into a tungsten layer. The tungsten layer is etched away by using an etch-back technique, and tungsten plugs 15b are left in the contact holes 13b. The photo-resist etching mask is stripped off, and a new photo-resist etching mask (not shown) is patterned on the thin silicon oxide layer. The photo-resist etching mask selectively exposes the thin silicon oxide layer and the polysilicon layer to etchant, and the polysilicon layer is patterned into conductive strips 15c and word lines W11/W12. The conductive strips 15c are held in contact with the tungsten plugs 15b, and the conductive strips over the active areas 11f/11g serve as gate electrodes 15d of the n-channel enhancement type driving transistors T11/T12 and gate electrodes 15e of the n-channel enhancement type transfer transistors T13/T14.

The second process sequence also starts with the deposition of the silicon oxide layer. The photo-resist etching mask (not shown) is patterned on the silicon oxide layer for the contact holes 13b, and the etchant selectively removes the silicon oxide layer, the field oxide layers 12b and the buried silicon oxide layer 11b so as to form the contact holes 13b. The photo-resist etching mask (not shown) is stripped off. Polysilicon is deposited over the entire surface of the resultant structure. The polysilicon fills the contact holes 13b, and swells into a polysilicon layer. A photo-resist etching mask is provided on the polysilicon layer, and the polysilicon layer is patterned into the conductive strips 15c and the word lines W11/W12.

Thus, the gate electrodes 15d/15e are formed on the gate oxide layers 15a through either process sequence. Using the gate electrodes 15d/15e as an ion-implantation mask, arsenic is ion implanted into the p-type silicon layer 11c at dose of $3\times10^{15}$ cm$^{-2}$ under accelerating energy of 40 KeV, and the arsenic forms n-type source regions 15f of the n-channel enhancement type driving transistors T11/T12, n-type source/drain regions 15g of the n-channel enhancement type transfer transistors T13/T14 and n-type common regions 15h of the n-channel enhancement type driving/transfer transistors T11/T12/ T13/T14. The outer periphery of the arsenic-implanted areas are indicated by hatching lines in FIG. 8A. The n-type common region 15h of the active area 11f and the n-type common region 15h of the active area 11g serve as memory nodes N11 and N12, respectively.

Figure 9A:
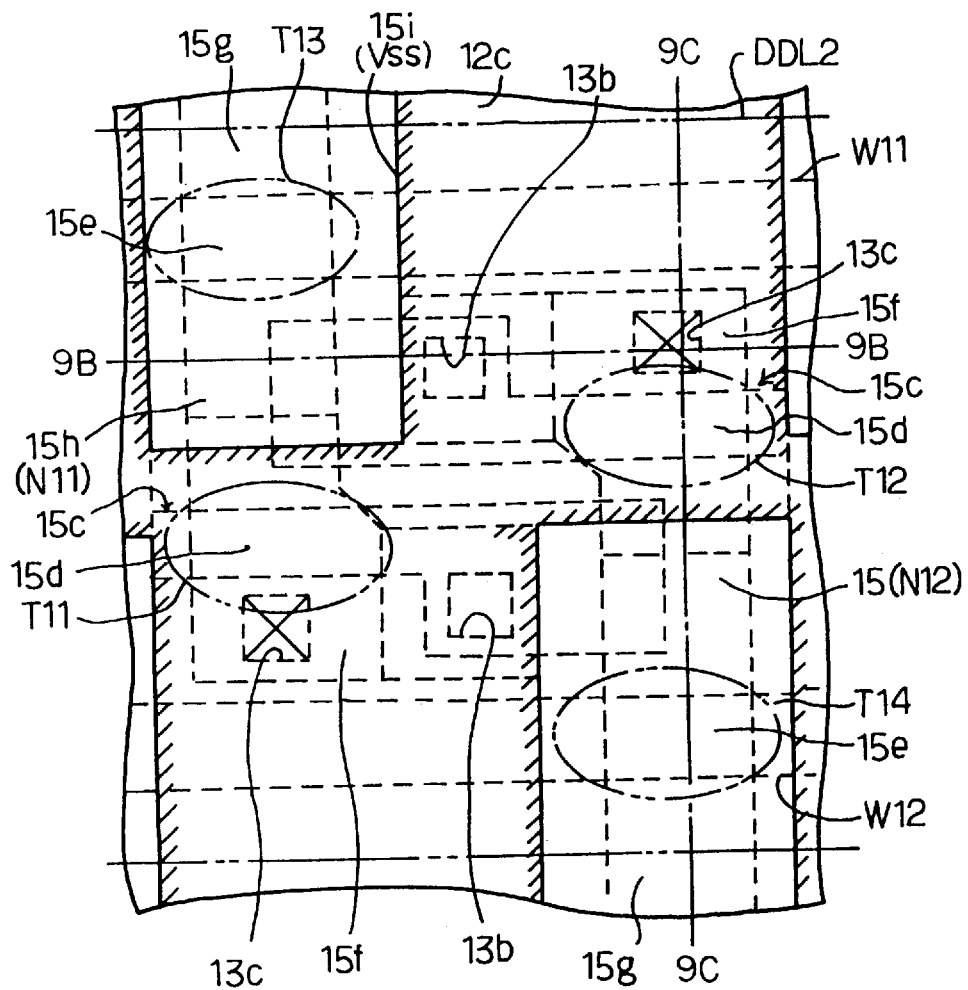
FIG. 9A is a plan view showing the layout of a resultant semiconductor structure in a fourth essential step.
Figure 9B:
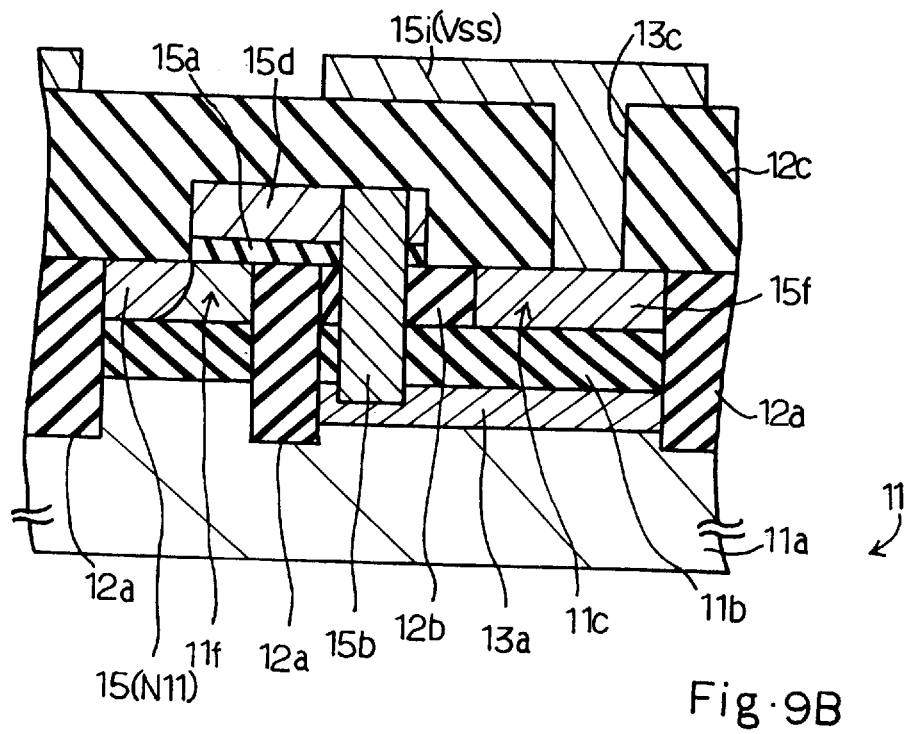
FIG. 9B is a cross sectional view taken along line H1—H1 of FIG. 9A and showing the structure of the resultant semiconductor structure.
Figure 9C:
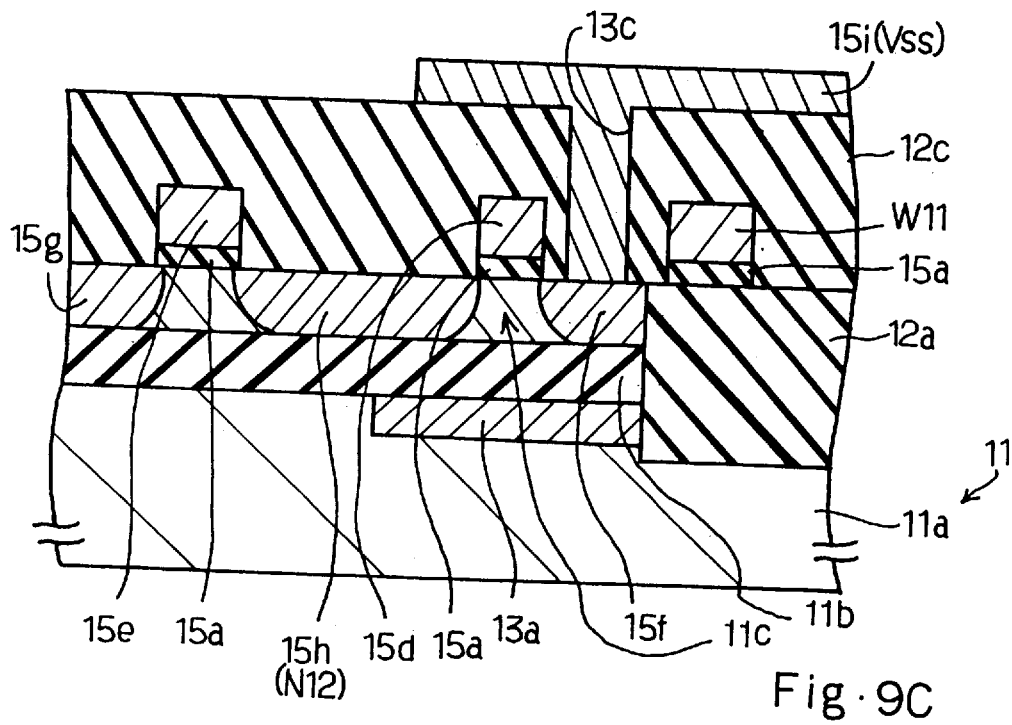
FIG. 9C is a cross sectional view taken along line H2—H2 of FIG. 9A and showing the structure of the resultant semiconductor structure from a different angle.

Subsequently, a ground voltage line Vss is connected to the n-type source regions 15f of the n-channel enhancement type driving transistors T11/T12 as shown in FIGS. 9A, 9B and 9C. Insulating material is deposited over the resultant semiconductor structure, and forms a first inter-level insulating layer 12c covering the word lines W11/W12 and the conductive strips 15c. A photo-resist etching mask (not shown) is provided on the first inter-level insulating layer 12c, and has opening over the n-type source regions 15f. Etchant selectively removes the inter-level insulating layer 12c exposed to the openings, and forms contact holes 13c in the first inter-level insulating layer 12c. The contact holes 13c is marked with "ix" in FIG. 9A. The photo-resist etching mask is stripped off.

Tungsten is deposited over the first inter-level insulating layer 12c. The tungsten fills the contact holes 13c, and swells into a tungsten layer. A photo-resist etching mask (not shown) is formed on the tungsten layer, and the tungsten layer is patterned into a tungsten strip 15i. The photo-resist etching mask is stripped off. The tungsten strip 15i serves as the ground voltage line Vss. The outer periphery of the tungsten strip 15i is indicated by hatching lines in FIG. 9A.

Figure 10A:
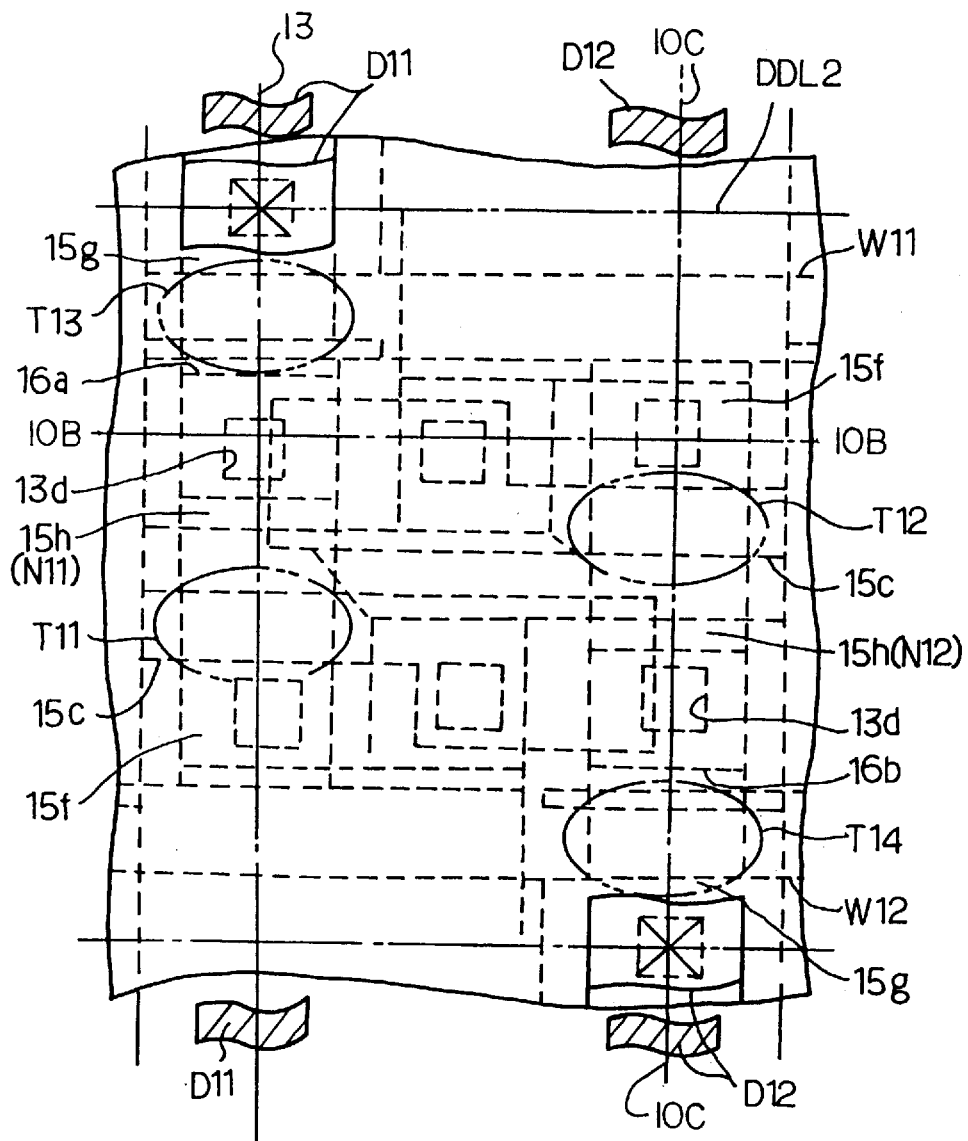
FIG. 10A is a plan view showing the layout of a resultant semiconductor structure in a fifth essential step.
Figure 10B:
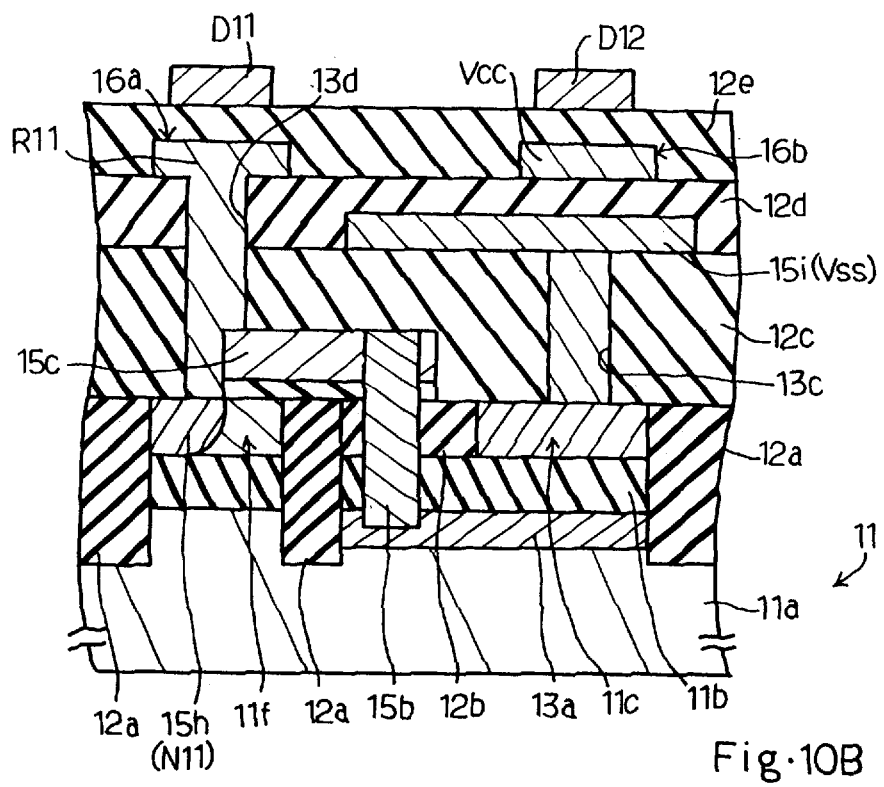
FIG. 10B is a cross sectional view taken along line I1—I1 of FIG. 10A and showing the structure of the resultant semiconductor structure.
Figure 10C:
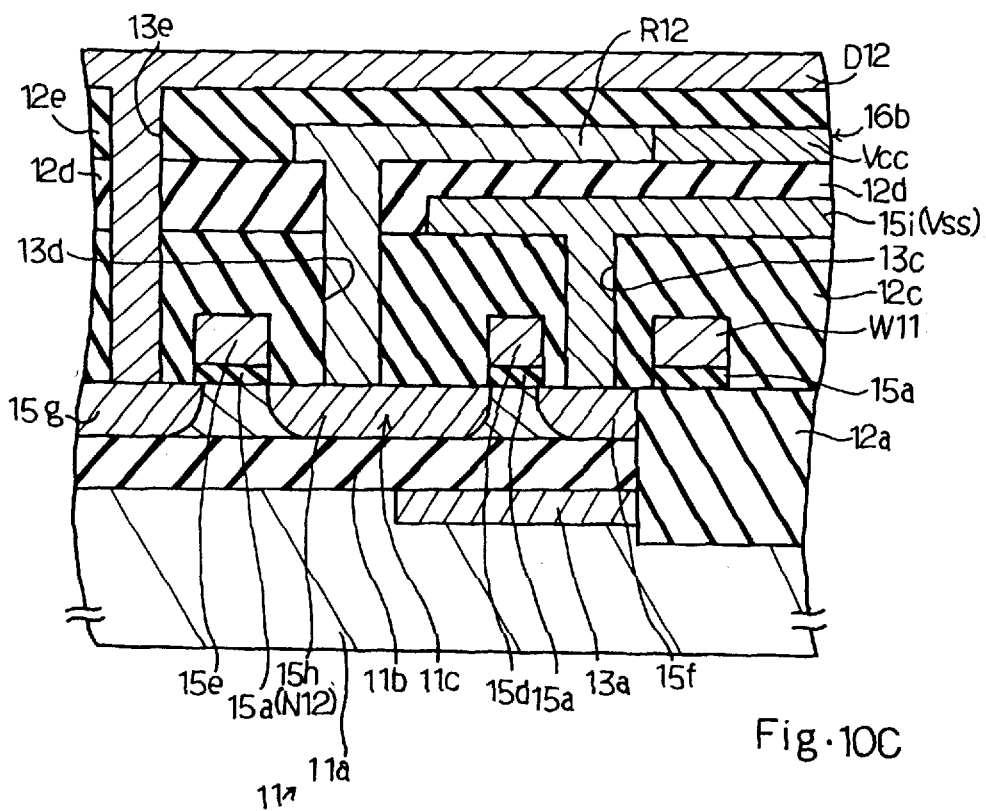
FIG. 10C is a cross sectional view taken along line I2—I2 of FIG. 10A and showing the structure of the resultant semiconductor structure from a different angle.

Subsequently, the highly resistive load elements R11/R12, the power supply line Vcc and the digit lines D11/D12 are formed as shown in FIGS. 10A, 10B and 10C.

Insulating material is deposited over the tungsten strip 15i on the first inter-level insulating layer 12c, and forms a second inter-level insulating layer 12d. A photo-resist etching mask (not shown) is provided on the second inter-level insulating layer 12d, and has opening over the n-type common regions 15h. Using the photo-resist etching mask, the first and second inter-level insulating layers 12c/12d are selectively etched away, and contact holes 13d are formed in the first and second inter-level insulating layers 12c/12d. The n-type common regions 15h are exposed to the contact holes 13d, respectively. The photo-resist etching mask is stripped off.

Intentionally undoped polysilicon is deposited over the second inter-level insulating layer 12d. The intentionally undoped polysilicon fills the contact holes 13d, and swells into an undoped polysilicon layer on the second inter-level insulating layer 12d. Phosphorous is ion-implanted into the undoped polysilicon layer at dose of $1\times10^{14}$ cm$^{-2}$, and forms a resistive polysilicon layer. An ion-implantation mask (not shown) is formed from a silicon nitride layer, and exposes a part of the resistive polysilicon layer used for a positive power supply line Vcc to arsenic ion implanted thereto at dose of $1\times10^{16}$ cm$^{-2}$ The polysilicon layer is treated with heat so as to activate the ion-implanted impurities. The ion-implantation mask is removed. A photo-resist etching mask (not shown) is formed on the polysilicon layer, and the polysilicon layer is patterned into polysilicon strips 16a/16b. The polysilicon strips 16a/16b doped with the phosphorous serve as the highly resistive load elements R11/R12, and the polysilicon strips 16a/16b doped with the phosphorous and the arsenic serve as the positive power supply line Vcc. In this instance, the positive power supply line Vcc and the ground voltage line Vss are shared between sixteen static random access memory cells.

Insulating material is deposited over the polysilicon strips 16a/16b on the second inter-level insulating layer 12d, and forms a third inter-level insulating layer 12e. The first, second and third inter-level insulating layers 12c, 12d and 12e as a whole constitute an inter-level insulating structure.

A photo-resist etching mask (not shown) is formed on the third inter-level insulating layer 12e, and has openings over the n-type source/drain regions 15g. Using the photo-resist etching mask, the first, second and third inter-level insulating layers 12c/12d/12e are selectively etched away, and contact holes 13e are formed in the first, second and third inter-level insulating layers 12c/12d/12e. The contact holes 13e are marked with "x" in FIG. 10A. The n-type source/drain regions 15g are exposed to the contact holes 13e, respectively. The photo-resist etching mask is stripped off.

Aluminum or aluminum alloy is deposited over the third inter-level insulating layer 12e. The aluminum or the aluminum alloy fills the contact holes 13e, and swells into a metal layer. A photo-resist etching mask (not shown) is formed on the metal layer, and the metal layer is patterned into the digit lines D11/D12. After the patterning, the photo-resist etching mask is stripped off.

Only parts of the digit lines D11/D12 are shown in FIG. 10A, and dot-and-dash lines I2 and I3 and cross sections indicate the digit lines D12/D11.

In the above described embodiment, the field oxide layer 12a and the field oxide layers 12a/12b serve as a first isolating layer and a second isolating layer, respectively, and the n-type impurity regions 13a are first and second impurity regions. First and second conductive members are respectively implemented by the tungsten plugs 15b. The first, second and third inter-level insulating layers 12c/12d/12e as a whole constitute an inter-level insulating structure. The digit lines D11/D12 serve as first and second signal lines, respectively.

The semiconductor static random access memory cell behaves as follows. A data bit is stored in the semiconductor static random access memory cell, and is assumed to be represented by a high potential level at the memory node N11 and a low potential level at the memory node N12.

When the data bit is accessed, the word lines W11/W12 are changed to a high potential level, and the n-channel enhancement type transfer transistors T13/T14 turn on so as to connect the n-type common regions 15h to the digit lines D11/D12, respectively. The potential difference between the memory nodes N11/N12 affects the potential level on the digit lines already equalized, and causes a small potential difference to take place between the digit lines D11 and D12. The p-n junctions between the n-type impurity regions 13a and the p-type silicon substrate 11a form additional capacitors coupled to the memory nodes N11/N12 through the conductive strips 15c, and increase the capacitance coupled to the n-type common regions 15h. For this reason, the potential variation at the memory nodes N11/N12 is relatively small, and the data bit is stably read out from the semiconductor static random access memory cell at high speed.

Even if the junction capacitors of the n-type common regions 15h are small in capacitance due to fluctuation of process parameters, the additional capacitors compensate the decrement, and reduces the production yield of the semiconductor static random access memory device.

Figure 11:
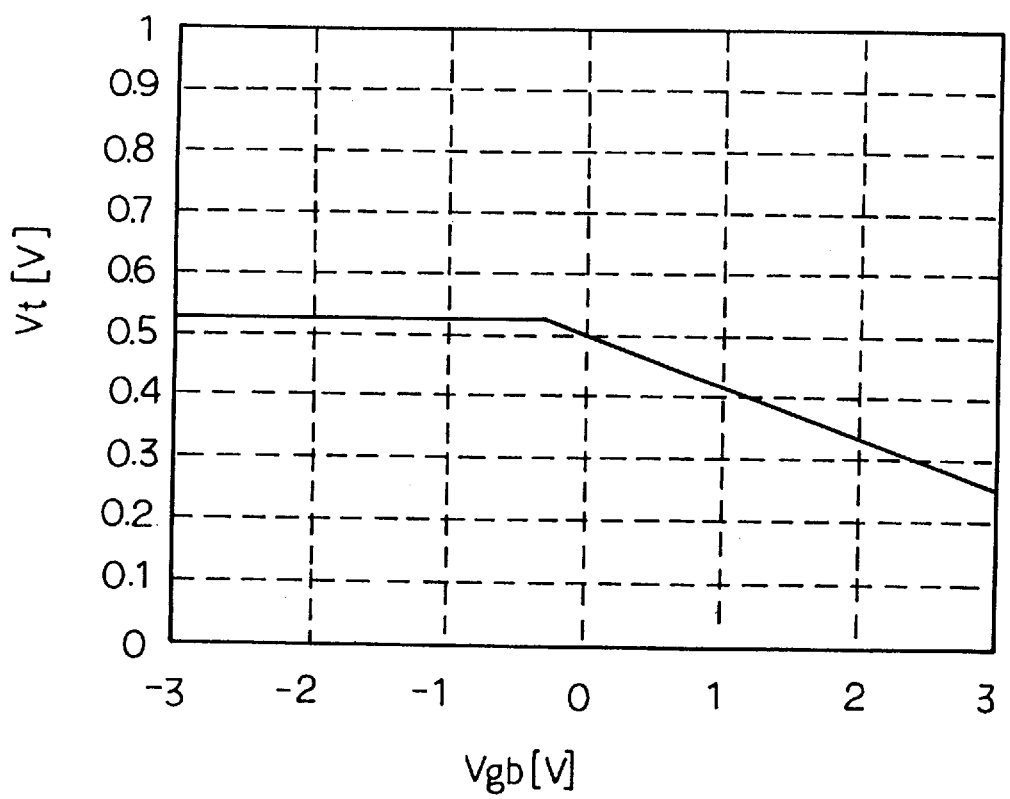
FIG. 11 is a graph showing a relation between a threshold of an n-channel enhancement type driving transistor and a potential level at n-type impurity region under a buried oxide layer.

FIG. 11 illustrates the threshold Vt of the n-channel enhancement type driving transistor T11/T12 in terms of the potential level Vgb of the n-type impurity region 13a. The n-type impurity regions 13a are electrically connected to the gate electrodes of the n-channel enhancement type driving transistors T11/T12, and are equal in potential level thereto. The threshold Vt is decreased by increasing the gate potential. For this reason, the potential difference between the gate potential and the threshold is larger than the prior art semiconductor static random access memory cell, and a large amount of current passes through the n-channel enhancement type driving transistors T11/T12. This results in a speed-up of the write-in operation. If the positive power voltage level is 2.5 volts, the threshold Vt is decreased by 0.2 volt, and the current is increased at 12 percent.

Second Embodiment

Figure 12A:
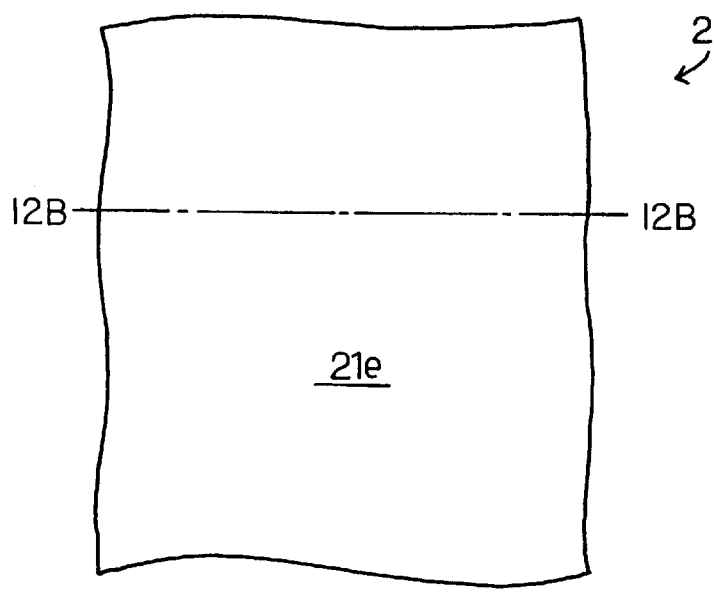
FIG. 12A is a plan view showing the major surface of a SOI substrate used for another semiconductor static random access memory cell according to the present invention.

FIGS. 12A/12B/12C to 17A/17B/17C illustrates another process of fabricating a semiconductor static random access memory cell embodying the present invention. The semiconductor static random access memory cell has the same circuit configuration as the first embodiment, and, for this reason, circuit components of the semiconductor static random access memory cell are hereinbelow labeled with the same references as those of the first embodiment without detailed description. The semiconductor static random access memory cell occupies an area enclosed with dots-and-dash line DDL3. The semiconductor static random access memory cell implementing the second embodiment is fabricated through a process described hereinbelow.

Figure 12B:
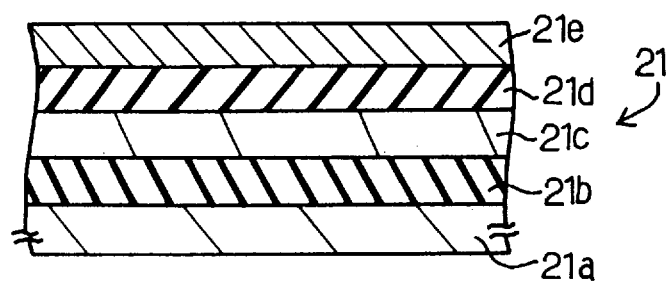
FIG. 12B is a cross sectional view taken along line J—J of FIG. 12A and showing the structure of the SOI substrate.

The process starts with preparation of an SOI substrate 21 as shown in FIGS. 12A and 12B. A p-type silicon substrate 21a is firstly prepared, and the dopant concentration is of the order of $1 \times 10^{17}$ cm$^{-3}$, and silicon oxide is grown to 50 nanometers thick on the p-type silicon substrate 21a by using the SIMOX technique. Then, the p-type silicon substrate 21a is overlain by a first buried silicon oxide layer 21b. P-type silicon is grown to 140 nanometers thick on the first buried silicon oxide layer 21b, and the first buried silicon oxide layer 21b is overlain by a first p-type silicon layer 21c. Silicon oxide is grown to 150 nanometers thick on the first p-type silicon layer 21c, and the first p-type silicon layer 21c is overlain by a second buried silicon oxide layer 21d. P-type silicon is grown to 110 nanometers thick on the second buried silicon oxide layer 21d, and the second buried silicon oxide layer 21d is overlain by a second p-type silicon layer 21e.

Figure 13A:
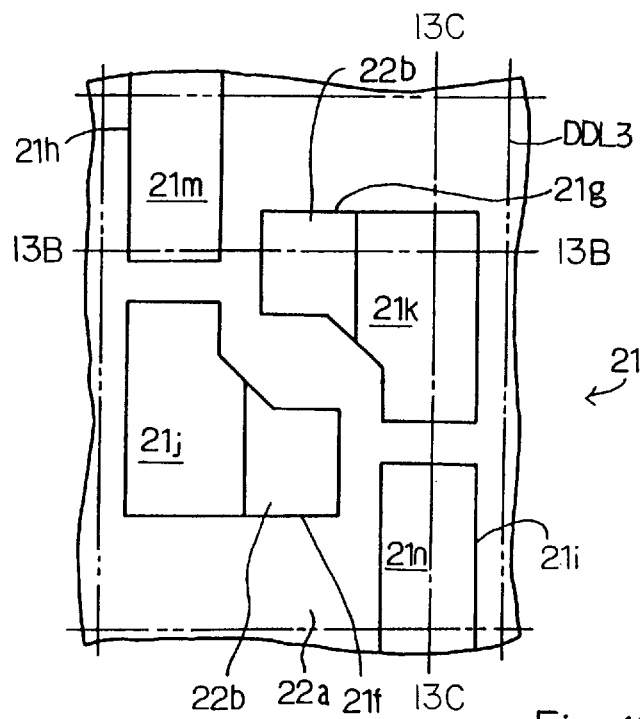
FIG. 13A is a plan view showing the layout of a resultant semiconductor structure in a first essential step.
Figure 13B:
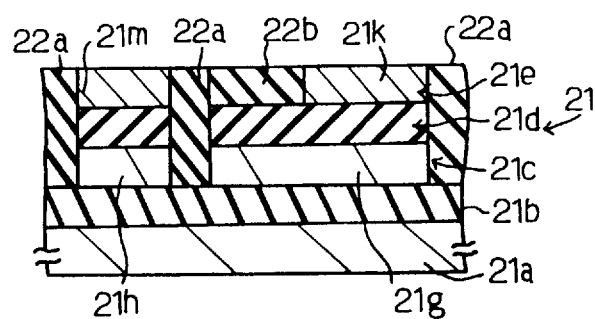
FIG. 13B is a cross sectional view taken along line K1—K1 of FIG. 13A and showing the structure of the resultant semiconductor structure.
Figure 13C:
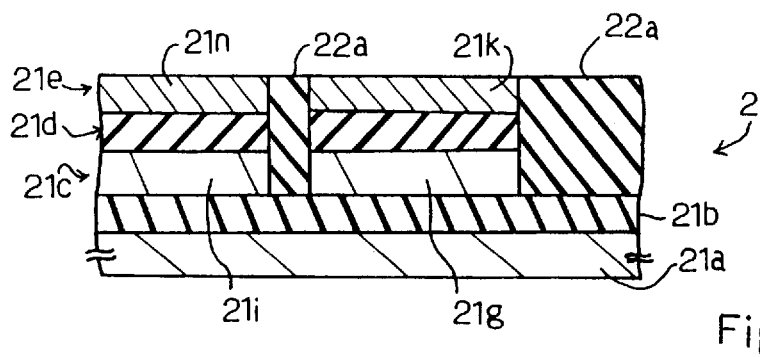
FIG. 13C is a cross sectional view taken along line K2—K2 of FIG. 13A and showing the structure of the resultant semiconductor structure from a different angle.

Subsequently, field oxide layers 22a and 22b are selectively grown on the SOI substrate 21 as shown in FIG. 13A, 13B and 13C. The field oxide layer 22a penetrates through the second p-type silicon layer 21e, the second buried silicon oxide layer 21d and the first p-type silicon layer 21e, and is held in contact with the first buried silicon oxide layer 21b. The field oxide layer 22a defines active areas 21f/21g and dummy areas 21h/21i in the first p-type silicon layer 21c. On the other hand, the field oxide layer 22b reach the first buried silicon oxide layer 21d, and the field oxide layers 22a/22b define active areas 11f and 11g in the second p-type silicon layer 21e.

Figure 14A:
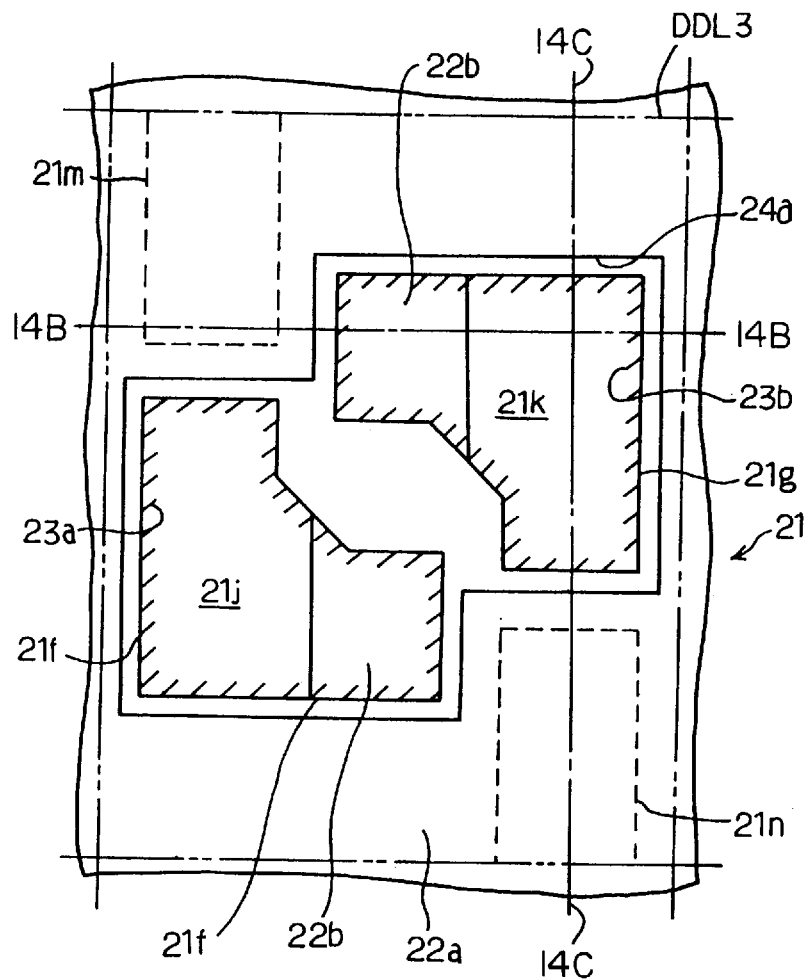
FIG. 14A is a plan view showing the layout of a resultant semiconductor structure in a second essential step.
Figure 14B:
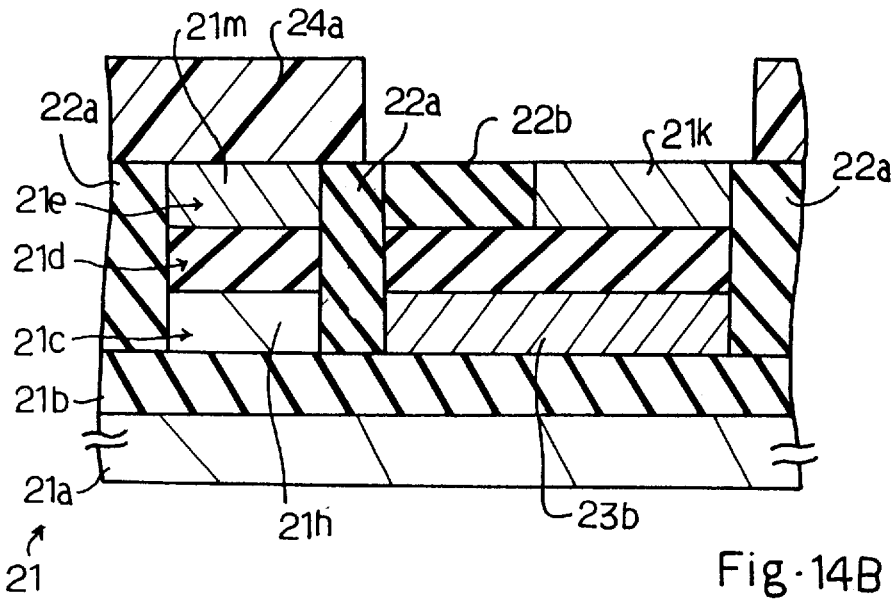
FIG. 14B is a cross sectional view taken along line L1—L1 of FIG. 14A and showing the structure of the resultant semiconductor structure.
Figure 14C:
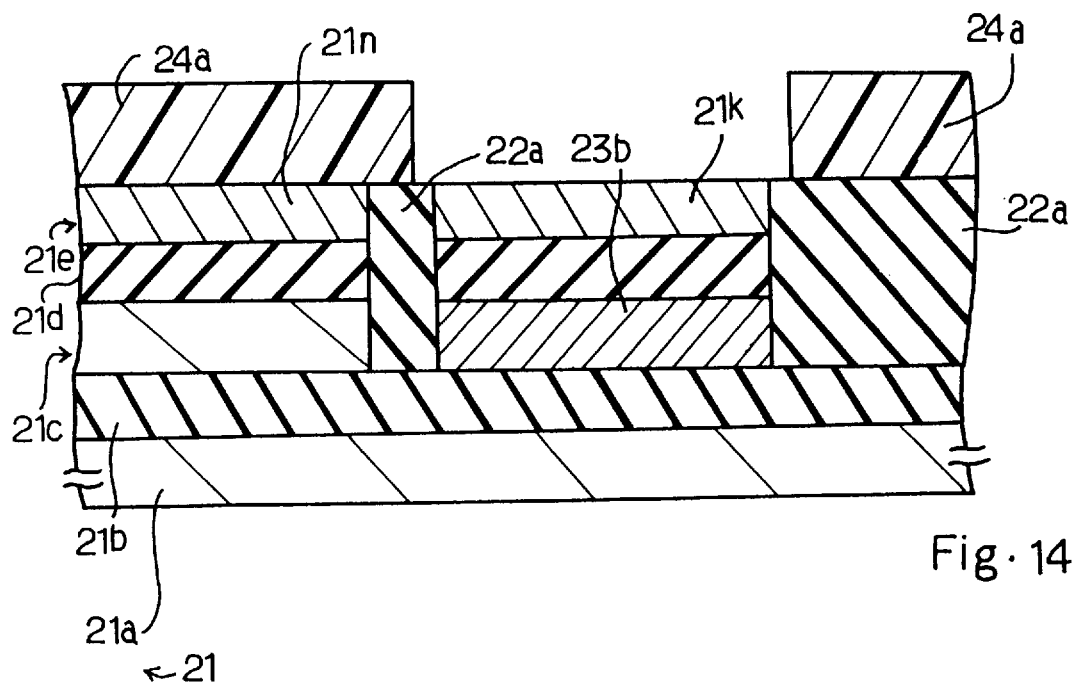
FIG. 14C is a cross sectional view taken along line L2—L2 of FIG. 14A and showing the structure of the resultant semiconductor structure from a different angle.

Subsequently, n-type impurity regions 23a/23b are formed in the active areas 21j/21k for additional capacitors as shown in FIGS. 14A, 14B and 14C. A photo-resist ion-implantation mask 24a is provided on the resultant semiconductor structure, and has openings over the active areas 21f/21g. Phosphorous is ion implanted into the first p-type silicon substrate 11a at dose of $1 \times 10^{14}$ cm$^{-2}$ under accelerating energy of 250 KeV. The phosphorous penetrates through the first p-type silicon layer 21e/the field oxide layer 22b and the first buried silicon oxide layer 21d, and forms the n-type impurity regions 23a/23b in the first p-type silicon layer 21c. The outer periphery of the ion-implanted areas or the n-type impurity regions 23a/23b are indicated by hatching lines in FIG. 14A. The photo-resist ion-implantation mask 24a is stripped off.

Figure 15A:
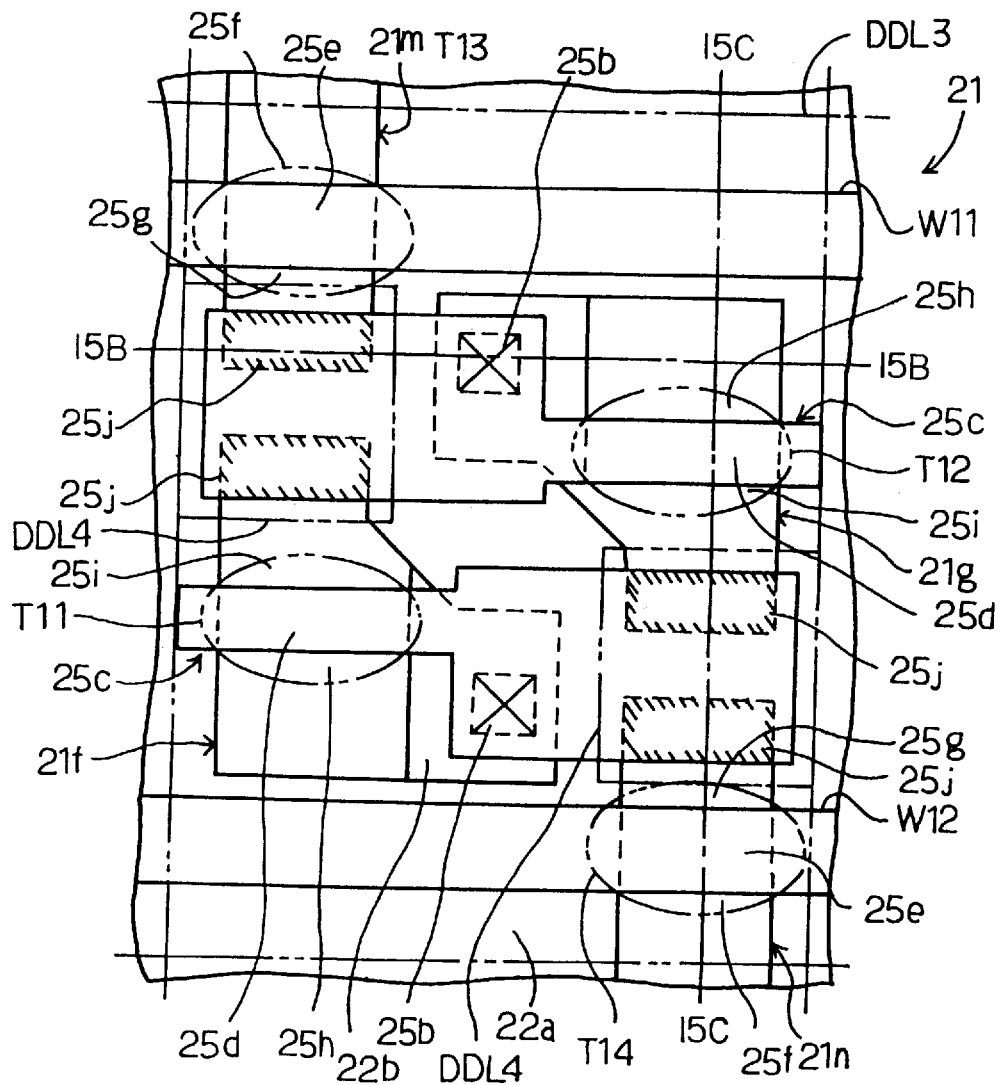
FIG. 15A is a plan view showing the layout of a resultant semiconductor structure in a third essential step.
Figure 15B:
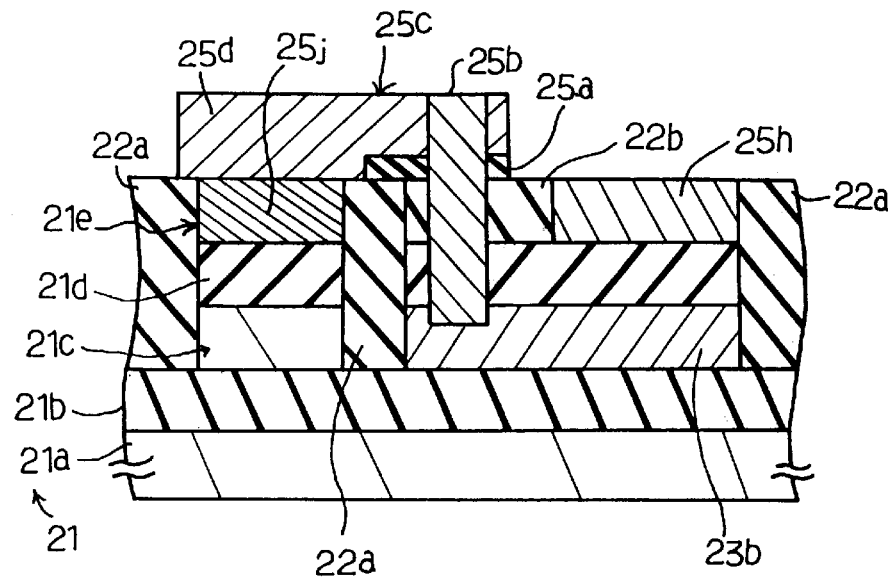
FIG. 15B is a cross sectional view taken along line M—M1 of FIG. 15A and showing the structure of the resultant semiconductor structure.
Figure 15C:
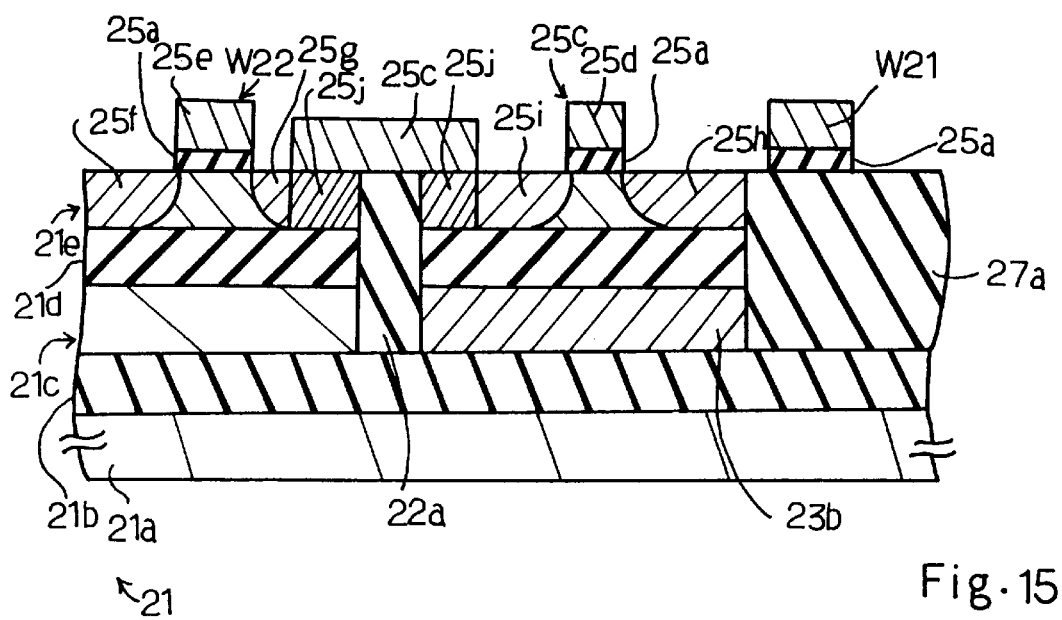
FIG. 15C is a cross sectional view taken along line M2—M2 of FIG. 15A and showing the structure of the resultant semiconductor structure from a different angle.

Subsequently, gate structures and interconnecting members are formed for the n-channel enhancement type driving transistors T11/T12 and the n-channel enhancement type transfer transistors T13/T14 as shown in FIGS. 15A, 15B and 15C. A gate oxide layer 25a is deposited, and tungsten plugs 25b provide electrical interconnection between the n-type impurity regions 23b and parts of conductive strips 25c. Conductive strips 25c and word lines W21/W22 provide gate electrodes 25d of the n-channel enhancement type driving transistors T11/T12 and gate electrodes 25e of the n-channel enhancement type transfer transistors T13/T14. N-type source/drain regions 25f/25g of the n-channel enhancement type transfer transistors T13/T14, n-type source regions 25h and n-type drain regions 25i of the n-channel enhancement type driving transistors T11/T12 are formed in the active areas 21m/21n and 21j/21k. The process sequence in this step is similar to that of the first embodiment except for removal of the gate oxide layer 25a from contact sub-areas 25j of the n-type source/drain regions 25g and the n-type drain regions 25i. The opening in the gate oxide layer 25a are indicated by dots-and-dash lines DDL4 in FIG. 15A. The conductive strips 25c are wider than the conductive strips 15c, and are held in contact with the contact sub-areas 25j so as to provide electrical connections between the n-type source/drain regions 25g and the n-type drain regions 25i. The contacts between the conductive strips 25c and the contact sub-areas 25j are indicated by hatching lines. The n-type source/drain regions 25f/25g, the n-type source regions 25h and the n-type drain regions 25i are doped with arsenic ion implanted at dose of $3 \times 10^{15}$ cm$^{-2}$.

Figure 16A:
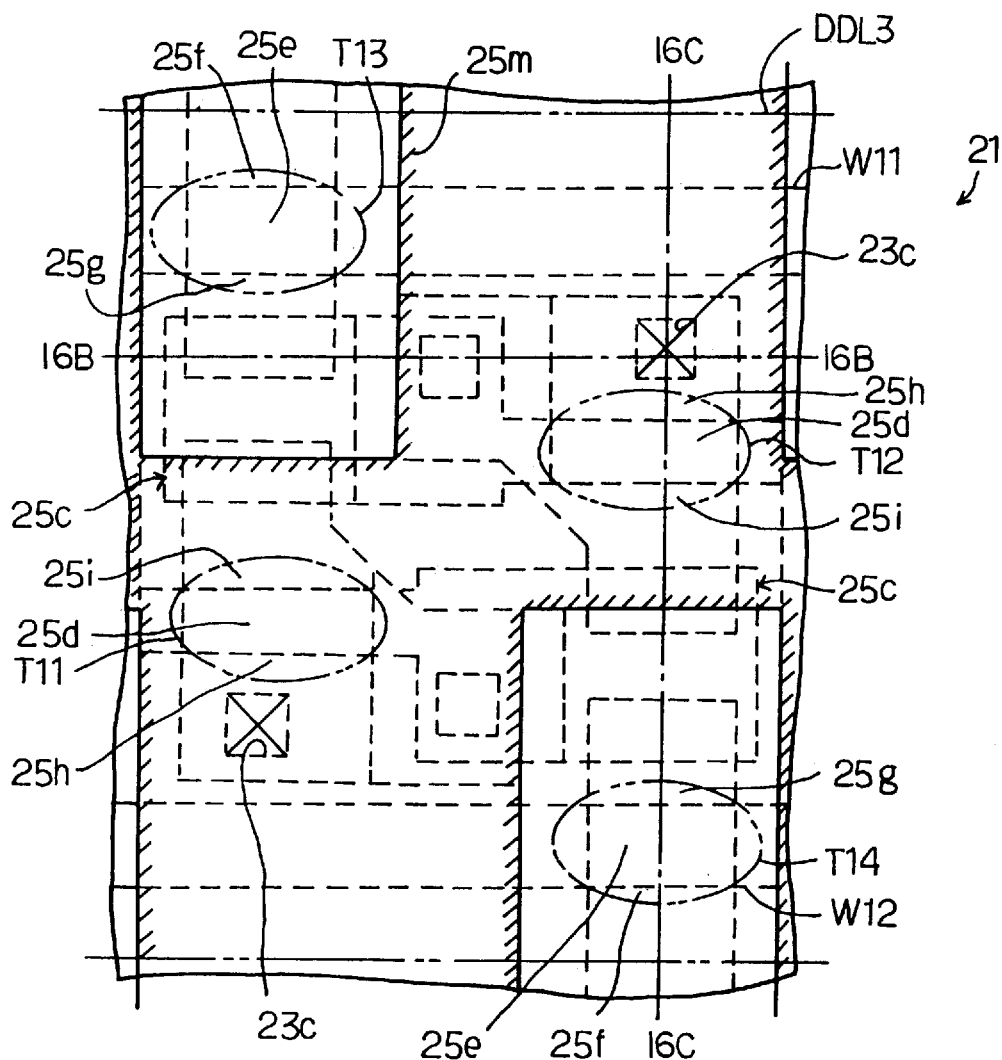
FIG. 16A is a plan view showing the layout of a resultant semiconductor structure in a fourth essential step.
Figure 16B:
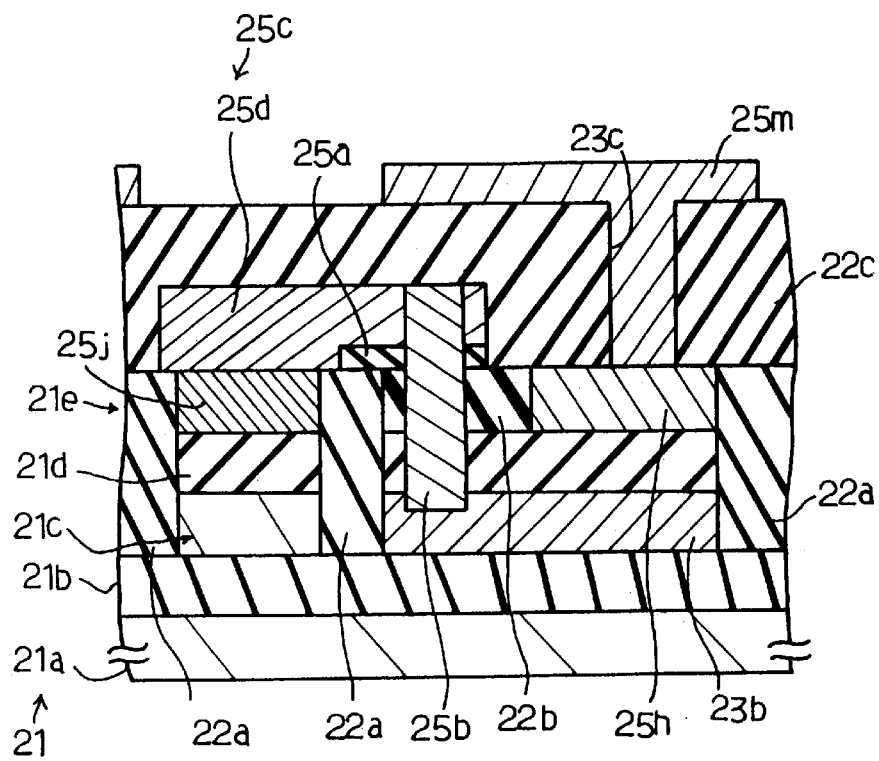
FIG. 16B is a cross sectional view taken along line N1—N1 of FIG. 16A and showing the structure of the resultant semiconductor structure.
Figure 16C:
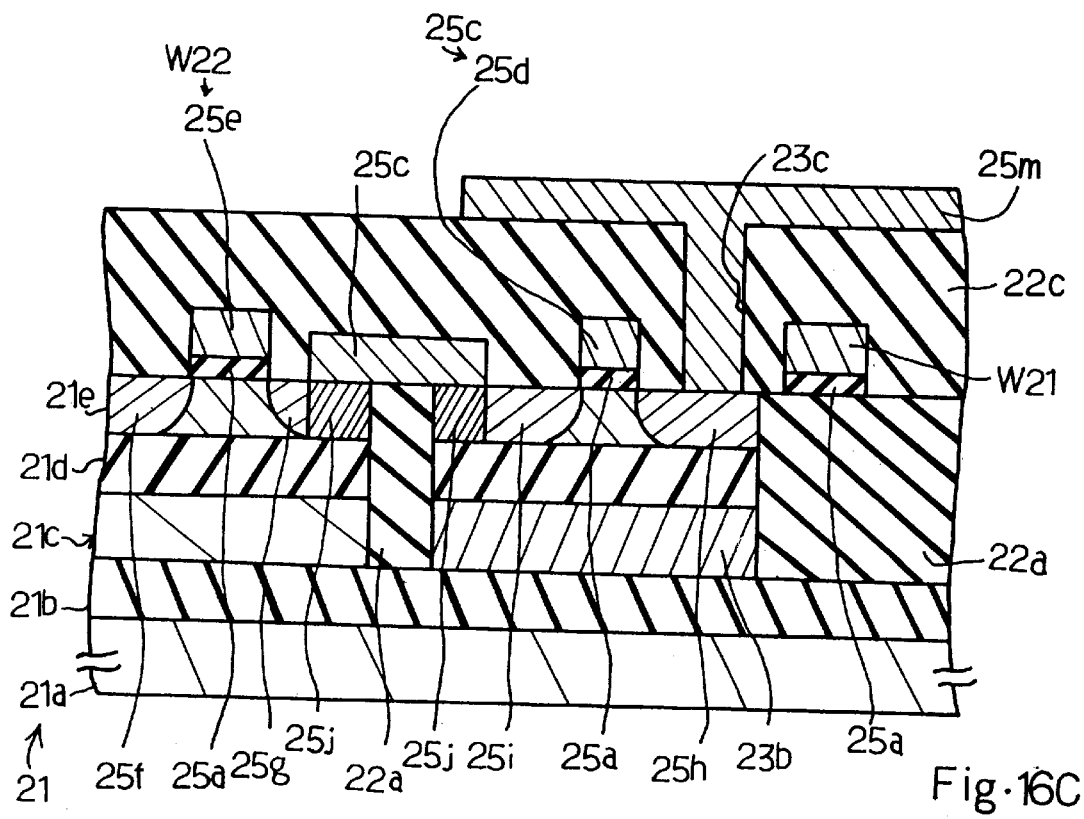
FIG. 16C is a cross sectional view taken along line N2—N2 of FIG. 16A and showing the structure of the resultant semiconductor structure from a different angle.

Subsequently, a ground voltage line Vss is connected to the n-type source regions 25h of the n-channel enhancement type driving transistors T11/T12 as shown in FIGS. 16A, 16B and 16C. Insulating material is deposited over the resultant semiconductor structure, and forms a first inter-level insulating layer 22c covering the word lines W11/W12 and the conductive strips 25c. A photo-resist etching mask (not shown) is provided on the first inter-level insulating layer 22c, and has opening over the n-type source regions 25h. Etchant selectively removes the first inter-level insulating layer 22c exposed to the openings, and forms contact holes 23c in the first inter-level insulating layer 22c. The contact holes 23c is marked with "x" in FIG. 16A. The photo-resist etching mask is stripped off.

Tungsten is deposited over the first inter-level insulating layer 22c. The tungsten fills the contact holes 23c, and swells into a tungsten layer. A photo-resist etching mask (not shown) is formed on the tungsten layer, and the tungsten layer is patterned into a tungsten strip 25m. The photo-resist etching mask is stripped off. The tungsten strip 25m serves as the ground voltage line Vss. The outer periphery of the tungsten strip 25m is indicated by hatching lines in FIG. 16A.

Figure 17A:
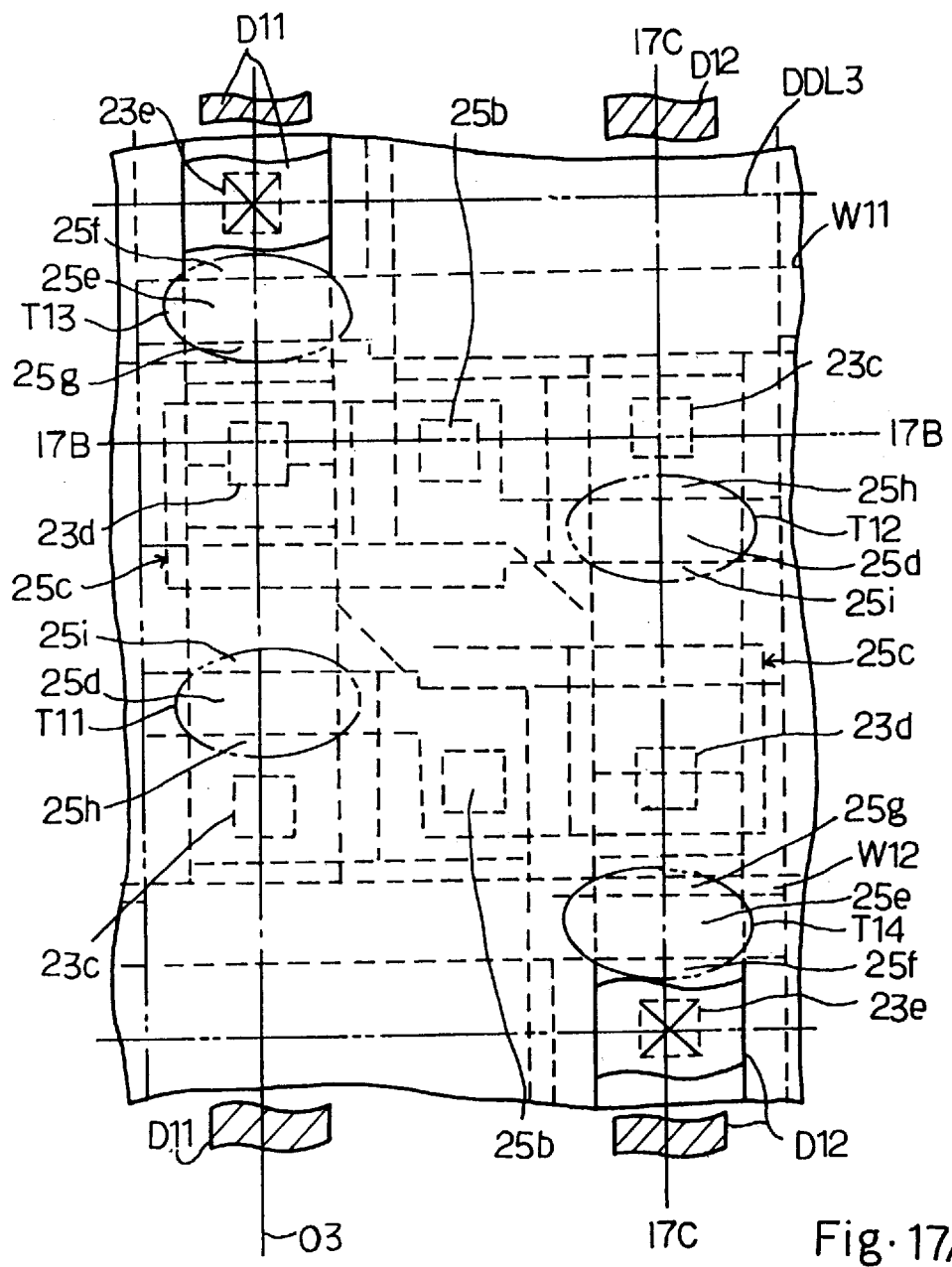
FIG. 17A is a plan view showing the layout of a resultant semiconductor structure in a fifth essential step.
Figure 17B:
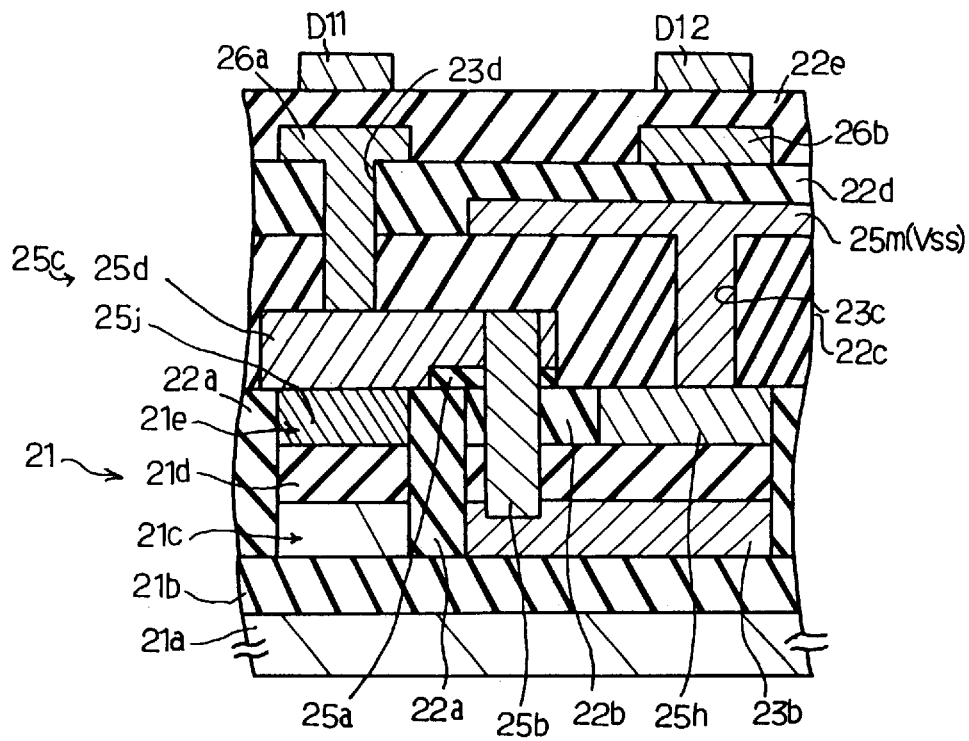
FIG. 17B is a cross sectional view taken along line O1—O1 of FIG. 17A and showing the structure of the resultant semiconductor structure.
Figure 17C:
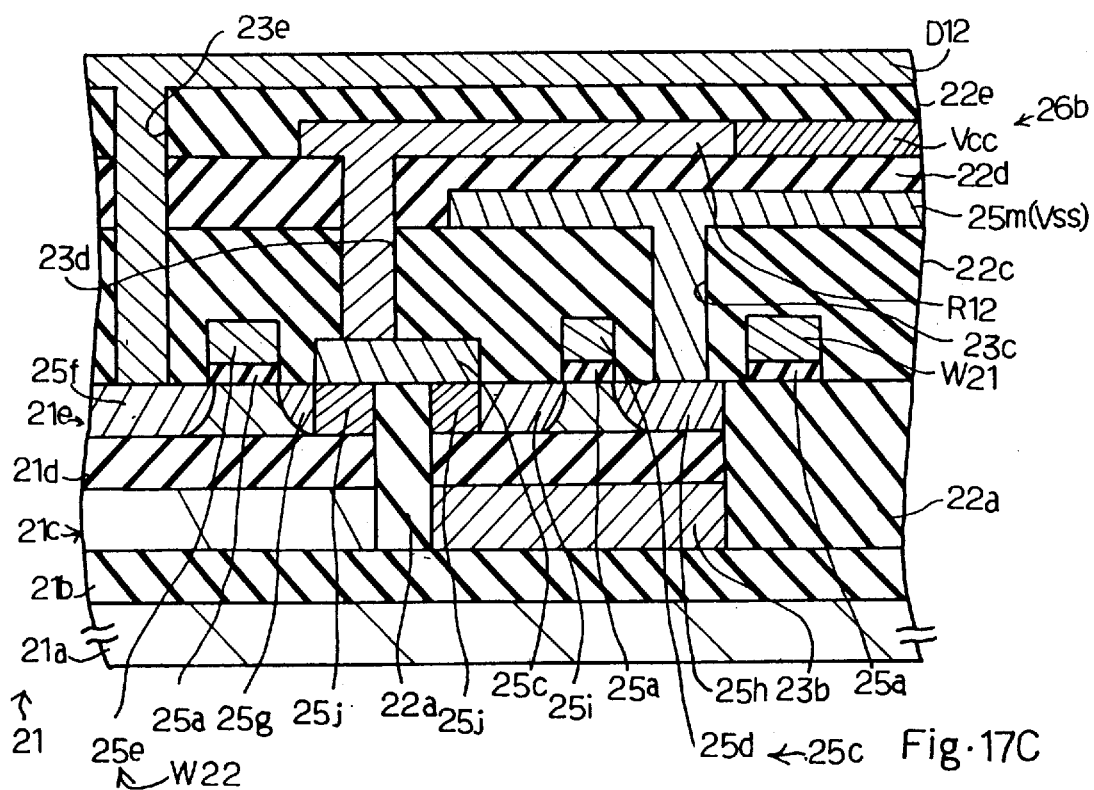
FIG. 17C is a cross sectional view taken along line O2—O2 of FIG. 17A and showing the structure of the resultant semiconductor structure from a different angle.

Subsequently, the highly resistive load elements R11/R12, the power supply line Vcc and the digit lines D11/D12 are formed as shown in FIGS. 17A, 17B and 17C.

Insulating material is deposited over the tungsten strip 25m on the first inter-level insulating layer 22c, and forms a second inter-level insulating layer 22d. A photo-resist etching mask (not shown) is provided on the second inter-level insulating layer 22d, and has opening over the contact areas 25j. Using the photo-resist etching mask, the first and second inter-level insulating layers 22c/22d are selectively etched away, and contact holes 23d are formed in the first and second inter-level insulating layers 22c/22d. The conductive strips 25c over the contact areas 25j are exposed to the contact holes 23d, respectively. The photo-resist etching mask is stripped off.

Intentionally undoped polysilicon is deposited over the second inter-level insulating layer 22d. The intentionally undoped polysilicon fills the contact holes 23d, and swells into an undoped polysilicon layer on the second inter-level insulating layer 22d. Phosphorous is ion-implanted into the undoped polysilicon layer, and forms a resistive polysilicon layer. An ion-implantation mask (not shown) is formed on the resistive polysilicon layer, and exposes a part of the resistive polysilicon layer used for a positive power supply line Vcc to arsenic ion implanted thereto. The polysilicon layer is treated with heat so as to activate the ion-implanted impurities. The ion-implantation mask is removed. A photo-resist etching mask (not shown) is formed on the polysilicon layer, and the polysilicon layer is patterned into polysilicon strips 26a/26b. The polysilicon strips 26a/26b doped with the phosphorous serve as the highly resistive load elements R11/R12, and the polysilicon strips 16a/16b doped with the phosphorous and the arsenic serve as the positive power supply line Vcc.

Insulating material is deposited over the polysilicon strips 26a/26b on the second inter-level insulating layer 22d, and forms a third inter-level insulating layer 22e. The first, second and third inter-level insulating layers 22c, 22d and 22e as a whole constitute an inter-level insulating structure.

A photo-resist etching mask (not shown) is formed on the third inter-level insulating layer 22e, and has openings over the n-type source/drain regions 25f. Using the photo-resist etching mask, the first, second and third inter-level insulating layers 22c/22d/22e are selectively etched away, and contact holes 23e are formed in the first, second and third inter-level insulating layers 22c/22d/22e. The contact holes 23e are marked with "x" in FIG. 17A. The n-type source/drain regions 25f are exposed to the contact holes 23e, respectively. The photo-resist etching mask is stripped off.

Aluminum or aluminum alloy is deposited over the third inter-level insulating layer 22e. The aluminum or the aluminum alloy fills the contact holes 23e, and swells into a metal layer. A photo-resist etching mask (not shown) is formed on the metal layer, and the metal layer is patterned into the digit lines D11/D12. After the patterning, the photo-resist etching mask is stripped off.

Only parts of the digit lines D11/D12 are shown in FIG. 17A, and dot-and-dash lines O2 and O3 and cross sections indicate the digit lines D12/D1.

The semiconductor static random access memory cell shown in FIGS. 17A to 17C is different from that of the first embodiment in the first buried silicon oxide layer 21b, the n-type source/drain regions 25g spaced from the n-type drain regions 25i by the field oxide layer 22a and the direct contact between the conductive strips 25c and the n-type regions 25g/25i. The first buried silicon oxide layer 21b does not allow electric charge to flow from the n-type impurity regions 23a/23b to the p-type silicon substrate 21a. The n-type impurity regions 23a/23b, the first buried silicon oxide layer 21b and the p-type silicon substrate 21a form additional capacitors, and the additional capacitors increases the capacitance coupled to the gate electrodes 25d of the n-channel enhancement type driving transistors T11/T12. The n-type impurity regions 23a/23b further lower the threshold of the n-channel enhancement type driving transistors T11/T12, and, accordingly, increase on-current.

As will be appreciated from the foregoing description, the additional capacitors enhances the stability of the semiconductor static random access memory cell, and accelerates a data read-out. Moreover, the n-type impurity regions increases the on-current of the n-channel enhancement type driving transistors, and, accordingly, increases the cell ratio without enlargement of the n-channel enhancement type driving transistors.

Although particular embodiments of the present invention have been shown and described, it will be obvious to those skilled in the art that various changes and modifications may be made without departing from the spirit and scope of the present invention.

For example, the highly resistive load elements may be implemented by bulk transistors or thin film transistors.

The n-type impurity regions may occupy a part of the active areas defined in the p-type silicon layer.

The differences may be exchanged between the first embodiment and the second embodiment.

What is claimed is:

1. A semiconductor static random access memory cell fabricated on a substrate having a first semiconductor layer of a first conductivity type, a first insulating layer formed on said first semiconductor layer and a second semiconductor layer of said first conductivity type formed on said first insulating layer, comprising:

first and second impurity regions formed in said first semiconductor layer, and having a second conductivity type opposite to said first conductivity type so as to form first and second additional capacitors;

a first isolating layer formed in a surface portion of said first semiconductor layer between said first and second impurity regions;

a second isolating layer formed in said second semiconductor layer in such a manner as to be held in contact with said first insulating layer so as to divide said second semiconductor layer into a first semiconductor sub-layer and a second semiconductor sub-layer;

a first driving transistor including first source and drain regions of said second conductivity type formed in a first portion of said first semiconductor sub-layer, a first gate insulating layer formed on a first channel region between said first source and drain regions and a first gate electrode formed on said first gate insulating layer and held in contact with said first impurity region through a first contact hole formed in said second isolating layer and said first insulating layer;

a first transfer transistor including second source and drain regions formed in a second portion of said first semiconductor sub-layer, a second gate insulating layer formed on a second channel region between said second source and drain regions and a second gate electrode formed on said second gate insulating layer, one of said second source and drain regions being connected to one of said first source and drain regions;

a second driving transistor including third source and drain regions of said second conductivity type formed in a first portion of said second semiconductor sub-layer, a third gate insulating layer formed on a third channel region between said third source and drain regions and a third gate electrode formed on said third gate insulating layer and held in contact with said second impurity region through a second contact hole formed in said second isolating layer and said first insulating layer;

a second transfer transistor including fourth source and drain regions formed in a second portion of said second semiconductor sub-layer, a fourth gate insulating layer formed on a fourth channel region between said fourth source and drain regions and a fourth gate electrode formed on said fourth gate insulating layer, one of said fourth source and drain regions being connected to one of said third source and drain regions;

a first conductive member connecting said one of said first source and drain regions to said third gate electrode;

a second conductive member connecting said one of said third source and drain regions to said first gate electrode;

an inter-level insulating structure covering said first driving transistor, said first transfer transistor, said second driving transistor and said second transfer transistor;

a first power supply line formed in said inter-level insulating structure, and connected through resistive elements to said one of said first source and drain regions and said one of said third source and drain regions;

a second power supply line different in potential level from said first power supply line, formed in said inter-level insulating structure, and connected to the other of said first source and drain regions and the other of said third source and drain regions; and first and second signal lines formed in said inter-level insulating structure, and connected to the other of said second source and drain regions and the other of said fourth source and drain regions.

2. The semiconductor static random access memory cell as set forth in claim 1, in which said first and second impurity regions are formed in parts of said first semiconductor layer so that p-n junctions take place in said first semiconductor layers.

3. The semiconductor static random access memory cell as set forth in claim 1, in which said first portion of said first semiconductor sub-layer is contiguous to said second portion of said first semiconductor sub-layer so that said one of said first source and drain regions and said one of said second source and drain regions are merged into a first common impurity region, and said first portion of said second semiconductor sub-layer is contiguous to said second portion of said second semiconductor sub-layer so that said one of said third source and drain regions and said one of said fourth source and drain regions are merged into a second common impurity region.

4. The semiconductor static random access memory device as set forth in claim 1, in which said substrate further has a second insulating layer formed under said first semiconductor layer and a third semiconductor layer formed under said second insulating layer, and said first isolating layer further isolates said first portion of said first semiconductor sub-layer and said first portion of said second semiconductor sub-layer from said second portion of said first semiconductor sub-layer and said second portion of said second semiconductor sub-layer, respectively, and penetrates said first semiconductor layer so as to be held in contact with said second insulating layer.

5. The semiconductor static random access memory cell as set forth in claim 4, in which said first conductive member is held in contact with said one of said one of said first source and drain regions and said one of said second source and drain regions, and said second conductive member is held in contact with said one of said third source and drain regions and said one of said fourth source and drain regions.

6. The semiconductor static random access memory cell as set forth in claim 1, in which said inter-level insulating structure has a first inter-level insulating layer covering said first driving transistor, said first transfer transistor, said second driving transistor and said second transfer transistor, a second inter-level insulating layer on said first inter-level insulating layer and a third inter-level insulating layer on said second inter-level insulating layer; and said second power supply line extends on said first inter-level insulating layer and is held in contact with said other of said first source and drain regions and said other of said third source and drain regions through first contact holes formed in said first inter-level insulating layer, said first power supply line and said resistive elements are formed on said second inter-level insulating layer and held in contact with said one of said first source and drain regions and said one of said third source and drain regions through second contact holes formed in said first and second inter-level insulating layers, and said first and second signal lines extend on said third inter-level insulating layer and respectively held in contact with said one of said second source and drain regions and said one of said fourth source and drain regions through third contact holes formed in said first, second and third inter-level insulating layers.

7. The semiconductor static random access memory cell as set forth in claim 1, in which said first channel region and said third channel region have a dopant concentration and a thickness selected in such a manner that said first channel region and said third channel region are substantially depleted when zero volt is applied to said first gate electrode and said third gate electrode.

* * * * *